(12) United States Patent
Yamazaki et al.

(10) Patent No.: US 7,224,118 B2
(45) Date of Patent: May 29, 2007

(54) DISPLAY DEVICE AND ELECTRONIC APPARATUS HAVING A WIRING CONNECTED TO A COUNTER ELECTRODE VIA AN OPENING PORTION IN AN INSULATING LAYER THAT SURROUNDS A PIXEL ELECTRODE

(75) Inventors: Shunpei Yamazaki, Tokyo (JP); Jun Koyama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 247 days.

(21) Appl. No.: 10/863,355

(22) Filed: Jun. 9, 2004

(65) Prior Publication Data

US 2004/0256620 A1    Dec. 23, 2004

(30) Foreign Application Priority Data

Jun. 17, 2003    (JP)    .............................. 2003-172009

(51) Int. Cl.
*H01J 1/62*    (2006.01)
(52) U.S. Cl. ...................... 313/506; 313/498
(58) Field of Classification Search ................ 313/504, 313/506, 512, 498
See application file for complete search history.

(56) References Cited

U.S. PATENT DOCUMENTS

| | | | |
|---|---|---|---|
| 4,786,358 | A | 11/1988 | Yamazaki et al. |
| 5,163,220 | A | 11/1992 | Zeto et al. |
| 5,227,252 | A | 7/1993 | Murayama et al. |
| 5,368,783 | A | 11/1994 | Kobayashi et al. |
| 5,399,936 | A | 3/1995 | Namiki et al. |
| 5,400,047 | A | 3/1995 | Beesely |
| 5,643,826 | A | 7/1997 | Ohtani et al. |

(Continued)

FOREIGN PATENT DOCUMENTS

| | | |
|---|---|---|
| EP | 1 045 451 | 10/2000 |
| JP | 07-130652 | 5/1995 |
| JP | 2002-033198 | 1/2002 |
| JP | 2002-335153 | 11/2002 |
| JP | 2003-255856 | 9/2003 |

OTHER PUBLICATIONS

Tsutsui et al., "Electroluminescence in Organic Thin Films," *Photochemical Processes in Organized Molecular Systems*, pp. 437-450, 1991.

(Continued)

*Primary Examiner*—Joseph Williams
*Assistant Examiner*—Bumsuk Won
(74) *Attorney, Agent, or Firm*—Fish & Richardson P.C.

(57) ABSTRACT

A display device in which variations in luminance due to variations in characteristics of transistors are reduced, and image quality degradation due to variations in resistance values is prevented. The invention comprises a transistor whose channel portion is formed of an amorphous semiconductor or an organic semiconductor, a connecting wiring connected to a source electrode or a drain electrode of the transistor, a light emitting element having a laminated structure which includes a pixel electrode, an electro luminescent layer, and a counter electrode, an insulating layer surrounding an end portion of the pixel electrode, and an auxiliary wiring formed in the same layer as a gate electrode of the transistor, a connecting wiring, or the pixel electrode. Further, the connecting wiring is connected to the pixel electrode, and the auxiliary wiring is connected to the counter electrode via an opening portion provided in the insulating layer.

40 Claims, 22 Drawing Sheets

U.S. PATENT DOCUMENTS

| | | | |
|---|---|---|---|
| 5,652,067 | A | 7/1997 | Ito et al. |
| 5,661,500 | A | 8/1997 | Shinoda et al. |
| 5,923,962 | A | 7/1999 | Ohtani et al. |
| 5,932,327 | A | 8/1999 | Inoguchi et al. |
| 6,008,588 | A | 12/1999 | Fujii |
| 6,023,073 | A * | 2/2000 | Strite ............... 257/40 |
| 6,037,712 | A | 3/2000 | Codama et al. |
| 6,087,770 | A | 7/2000 | Kaneko et al. |
| 6,124,604 | A | 9/2000 | Koyama et al. |
| 6,140,766 | A | 10/2000 | Okada et al. |
| 6,285,042 | B1 | 9/2001 | Ohtani et al. |
| 6,320,311 | B2 | 11/2001 | Nakaya et al. |
| 6,335,541 | B1 | 1/2002 | Ohtani et al. |
| 6,359,606 | B1 | 3/2002 | Yudasaka |
| 6,593,691 | B2 | 7/2003 | Nishi et al. |
| 6,608,449 | B2 | 8/2003 | Fukunaga |
| 6,630,687 | B1 | 10/2003 | Koyama et al. |
| 6,781,162 | B2 | 8/2004 | Yamazaki et al. |
| 2001/0024083 | A1 | 9/2001 | Yamazaki et al. |
| 2001/0043046 | A1 | 11/2001 | Fukunaga |
| 2002/0053670 | A1 | 5/2002 | Ohtani et al. |
| 2002/0158835 | A1 | 10/2002 | Kobayashi et al. |
| 2002/0167026 | A1 | 11/2002 | Azami et al. |
| 2003/0094895 | A1 * | 5/2003 | Okuyama et al. .......... 313/506 |
| 2004/0003939 | A1 | 1/2004 | Nishi et al. |
| 2004/0032202 | A1 | 2/2004 | Fukunaga |
| 2004/0046164 | A1 | 3/2004 | Kobayashi et al. |
| 2004/0075092 | A1 | 4/2004 | Arao |
| 2004/0084675 | A1 | 5/2004 | Koyama et al. |
| 2004/0119399 | A1 * | 6/2004 | Nagayama ............... 313/500 |
| 2004/0256620 | A1 | 12/2004 | Yamazaki et al. |
| 2005/0012454 | A1 | 1/2005 | Yamazaki et al. |
| 2005/0051776 | A1 | 3/2005 | Miyagi et al. |

OTHER PUBLICATIONS

Tsutsui et al., "High Quantum Efficiency in Organic Light-Emitting Devices with Iridium-Complex as a Triplet Emissive Center," *Japan Journal of Applied Physics*, vol. 38, part 2, No. 12B, pp. L1502-1504, Dec. 15, 1999.

M.A. Baldo et al.; "Highly Efficient Phosphorescent Emission From Organic Electroluminescent Devices"; *Nature*, vol. 395; pp. 151-154; Sep. 10, 1998.

M.A. Baldo et al.; "Very High-Efficiency Green Organic Light-Emitting Devices Based On Electrophosphorescence"; *Applied Physics Letters*, vol. 75, No. 1; pp. 4-6; Jul. 5, 1999.

\* cited by examiner

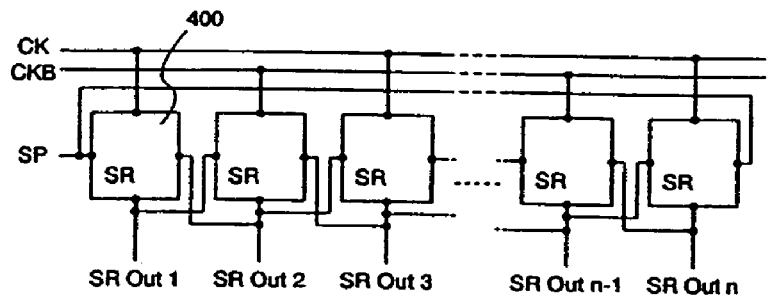
FIG.12A
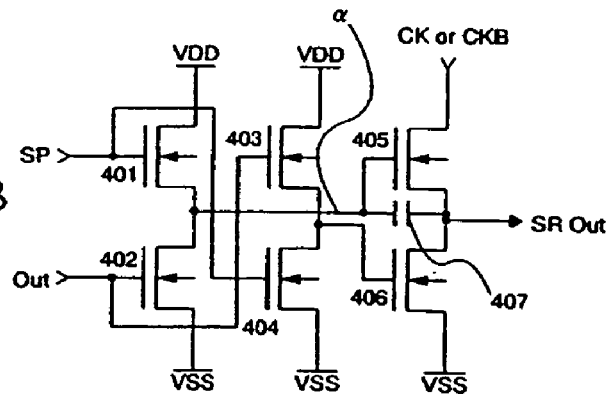
FIG.12B
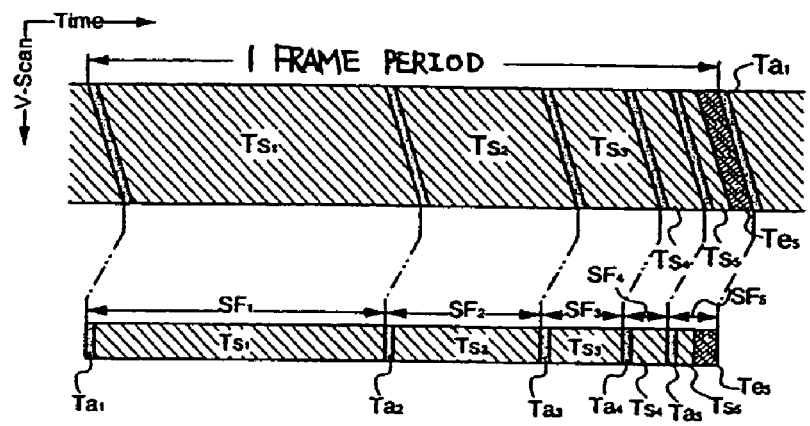
FIG.13A
FIG.13B

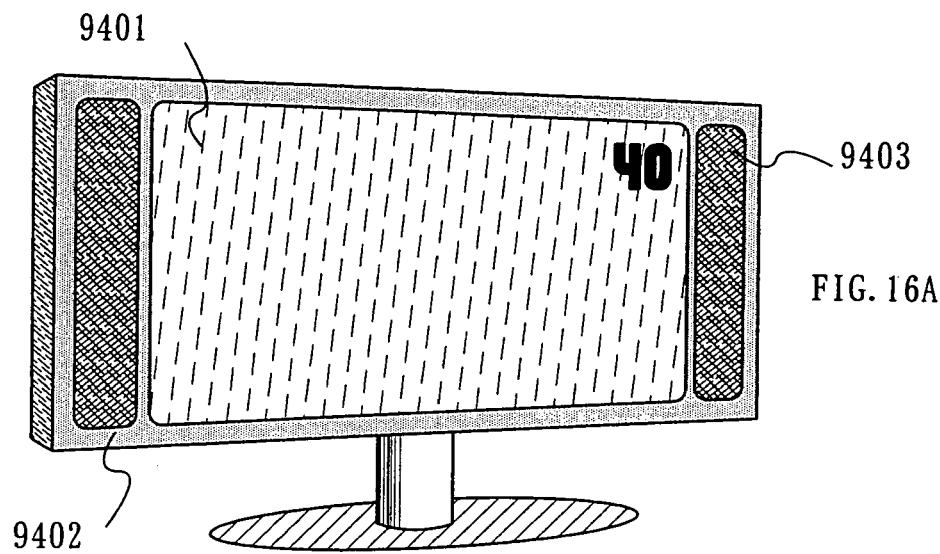
FIG. 16A
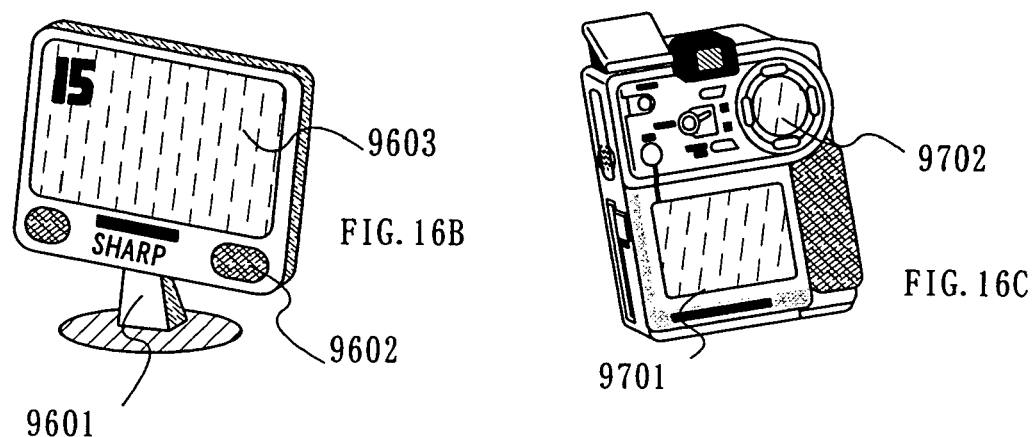
FIG. 16B
FIG. 16C
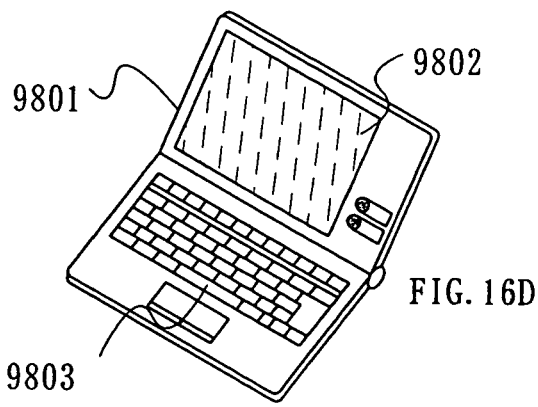
FIG. 16D

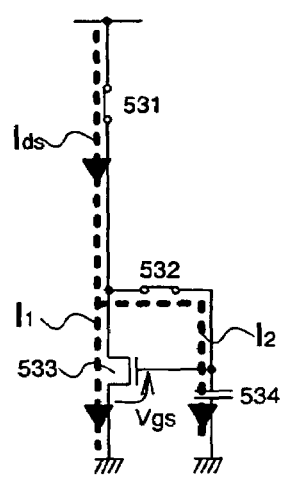 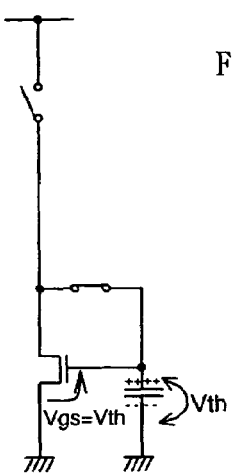 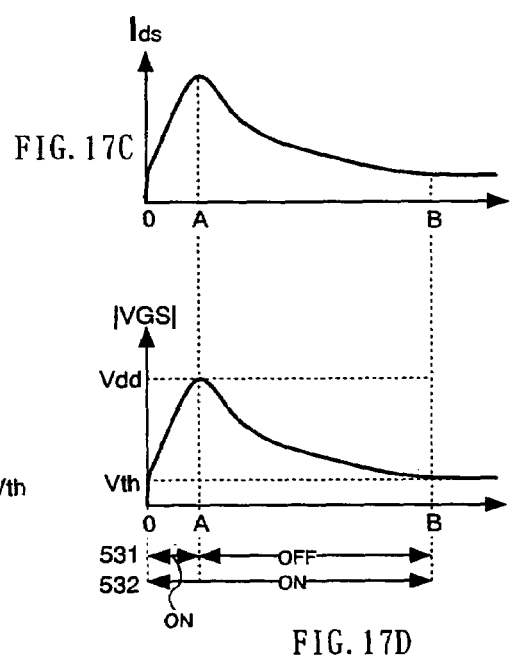
FIG. 17A  FIG. 17B  FIG. 17C  FIG. 17D

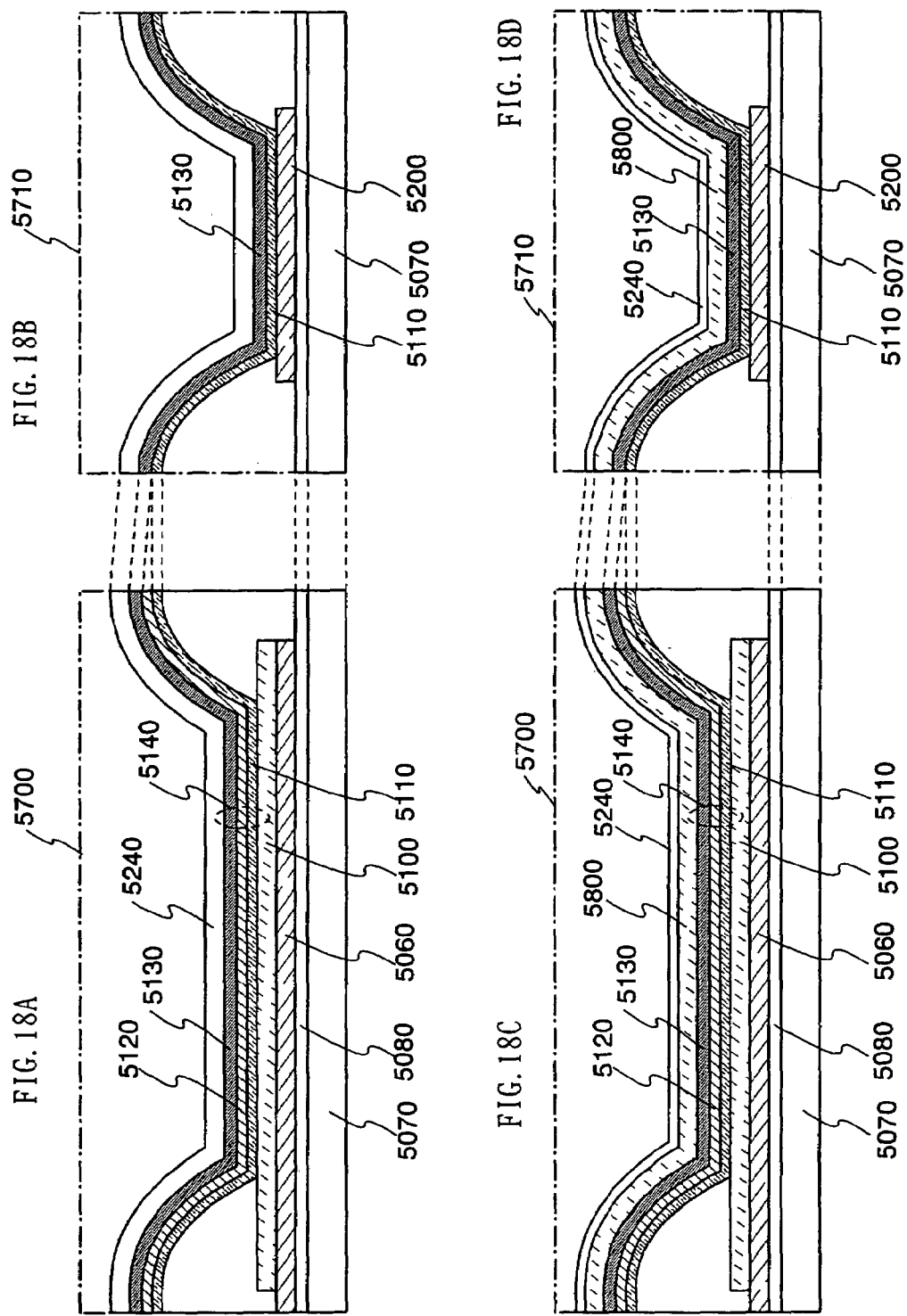

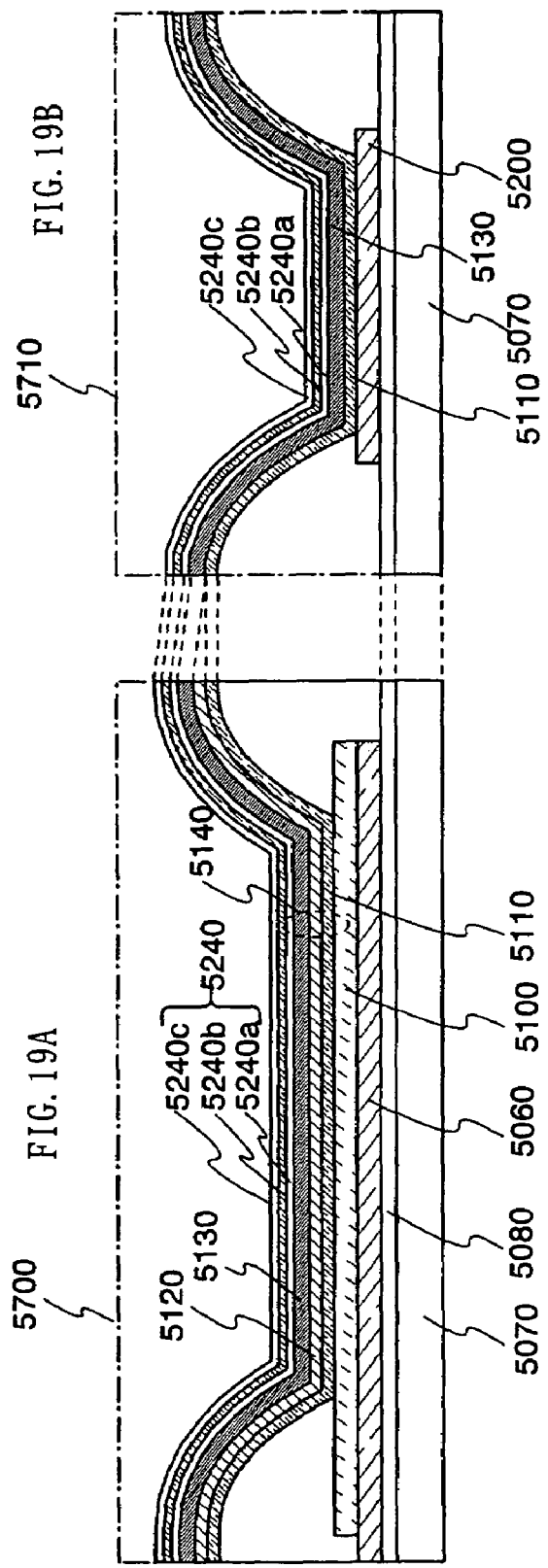

DISPLAY DEVICE AND ELECTRONIC APPARATUS HAVING A WIRING CONNECTED TO A COUNTER ELECTRODE VIA AN OPENING PORTION IN AN INSULATING LAYER THAT SURROUNDS A PIXEL ELECTRODE

BACKGROUND OF THE INVENTION

1. Field of the Invention

The present invention relates to a display device comprising a self-light emitting element and a transistor whose channel portion is formed of an amorphous semiconductor or an organic semiconductor.

2. Description of the Related Art

In recent years, a display device comprising a light emitting element has been actively developed. In addition to the advantages of a conventional liquid crystal display device, the light emitting display device has the features such as fast response, superior dynamic display and wide viewing angle. Therefore, the light emitting display device attracts a lot of attention as a next-generation flat panel display.

The light emitting display device comprises a plurality of pixels each having a light emitting element and at least two transistors. In each of the pixels, the transistor which is connected in series with the light emitting element controls light emission or non-light emission of the light emitting element. For the transistors, a polycrystalline semiconductor (polysilicon) with high field effect mobility is used in many cases. The light emitting element has a structure in which an electro luminescent layer is sandwiched between a pair of electrodes. Specifically, an electro luminescent layer is formed on a patterned first conductive layer (a first electrode), and then a second conductive layer (a second electrode) is formed so as to cover the whole surface of electro luminescent layer.

SUMMARY OF THE INVENTION

A transistor using polysilicon tends to have variations in characteristics due to crystal defects in grain boundaries. Accordingly, the drain current of the transistor differs in each pixel even when the same signal voltage is inputted, leading to variations in luminance.

In view of the foregoing, the invention provides a display device in which variations in luminance caused by variations in characteristics of transistors are suppressed.

It is preferable that the second conductive layer (the second electrode) formed over the electro luminescent layer is heated to lower resistance. However, the electro luminescent layer has a low heat resistance and can not withstand a high heat processing. Therefore, due to different resistance values, a voltage applied between a pair of electrodes is different between in the edges and the center of a light emitting element, which may result in degraded image quality.

In view of the foregoing, the invention provides a display device in which image quality degradation due to differences in resistance values is prevented.

To solve the aforementioned problems, the invention takes the following measures.

A display device according to the invention comprises a light emitting element which is controlled by a transistor whose channel portion is formed of an amorphous semiconductor (typified by amorphous silicon, a-Si:H) or an organic semiconductor. Since such a transistor has few variations in field effect mobility and the like, it is possible to suppress variations in luminance of the display device due to variations in characteristics of the transistor. Further, the amorphous semiconductor is suitable for manufacturing a large panel ranging from a few inches to a few tens of inches in size, and the manufacturing processes thereof are cost effective because no crystallizing step and a small number of masks are required.

A display device according to the invention comprises an auxiliary conductive layer (wiring) which is connected to a conductive layer formed over an electro luminescent layer. As a result, the resistance of the conductive layer can be lowered without heat processing, and image quality degradation of the display device can thus be prevented. Since the resistance value becomes a problem as a panel is increased in size, a large panel having a size of a few tens of inches can be manufactured very effectively by using the invention.

A display device according to the invention comprises a substrate which includes a pixel portion and a driver circuit arranged at the periphery of the pixel portion, and a driver IC which is attached on the substrate. The pixel portion comprises a light emitting element including a light emitting material sandwiched between a pair of electrodes, and a plurality of transistors whose channel portions are formed of an amorphous semiconductor. The driver circuit formed on the substrate comprises an N-type transistor whose channel portion is formed of an amorphous semiconductor (sometimes referred to as an a-Si:HTFT hereinafter), and a P-type transistor whose channel portion is formed of an organic semiconductor (sometimes referred to as an organic TFT hereinafter). The organic TFT corresponds to a transistor including a low molecular weight organic compound such as pentacene, a high molecular weight organic compound such as PEDOT (polythiophene) and PPV (polyphenylene-vinylene), and the like. The a-Si:HTFT and the organic TFT can be formed on the same substrate as the pixel portion, and using this CMOS circuit as a unit circuit, a shift register, a buffer and the like can be configured. Moreover, the driver circuit can be formed with either N-type transistors or P-type transistors only. In such a case, the driver circuit can be formed with either the a-Si:HTFTs or the organic TFTs only.

A display device according to the invention comprises a light emitting element which includes a light emitting material sandwiched between a first electrode connected to an anode line and a second electrode connected to a cathode line. The display device also comprises a transistor whose channel portion is formed of an amorphous semiconductor. The display device further comprises a reverse bias voltage applying circuit which switches potentials of the anode line and the cathode line with each other to apply a reverse bias voltage to the light emitting element. According to such a structure, degradation of the light emitting element with time can be prevented, leading to the display device with an improved reliability.

A display device according to the invention comprises a light emitting element which includes a light emitting material sandwiched between a pair of electrodes, a first transistor whose gate electrode is connected to a first power supply with a constant potential, and a second transistor whose gate electrode is connected to a signal line. The light emitting element, the first transistor, and the second transistor are connected in series between a second power supply with the same potential as a low potential voltage and a third power supply with the same potential as a high potential voltage.

Further, each of the first transistor and the second transistor has a channel portion formed of an amorphous semiconductor. In such a display device, the second transistor is operated in a linear region, and thus, the amount of current flowing in the light emitting element is not affected by a slight variation in $V_{GS}$ of the first transistor. In other words, the amount of current flowing in the light emitting element is determined by the first transistor which is operated in a saturation region. Therefore, according to the invention having the aforementioned structure, it is possible to provide a display device in which variations in luminance due to variations in characteristics of transistors are suppressed and image quality is improved.

By adopting the aforementioned structure, the invention can provide a display device in which variations in luminance due to variations in characteristics of transistors are suppressed. Further, in a display device according to the invention, the resistance of the conductive layer can be lowered without heat processing, and image quality degradation can be prevented. Moreover, the display device according to the invention comprises a transistor whose channel portion is formed of an amorphous semiconductor, and thus a large sized and inexpensive display device can be achieved.

BRIEF DESCRIPTION OF THE DRAWINGS

FIGS. 12A and 12B are circuit diagrams of a shift register formed with only N-type transistors.

FIGS. 13A and 13B are timing charts showing time gray scale.

FIGS. 16A to 16D are views showing electronic apparatuses using the invention.

FIGS. 17A to 17D are diagrams showing a threshold compensation circuit.

FIGS. 18A to 18D are views showing a laminated structure of a light emitting element.

FIGS. 19A and 19B are views showing a laminated structure of a light emitting element.

DETAILED DESCRIPTION OF THE INVENTION

Embodiment Mode 1

Figure 4A:
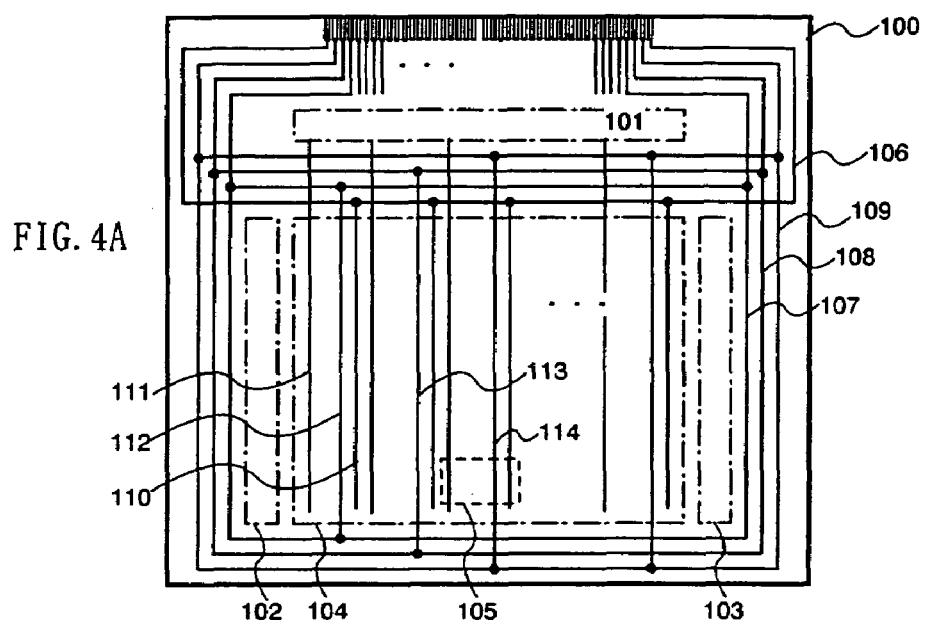
FIGS. 4A and 4B are top plan views of a panel showing an arrangement of an anode line, a cathode line, and an auxiliary wiring.
Figure 4B:
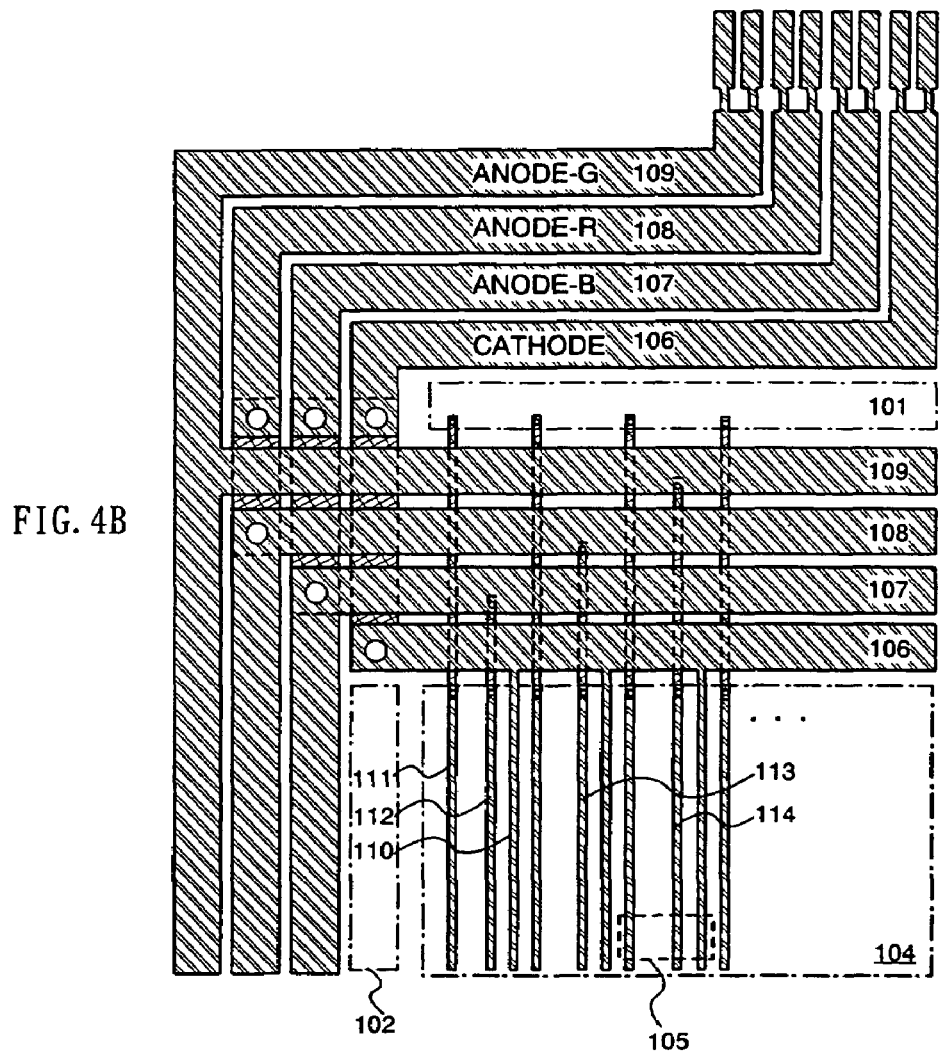

With reference to FIGS. 4A and 4B, explanation is made on an arrangement of wirings on a panel, especially an arrangement of a power supply line (hereinafter referred to as an anode line) with the same potential as a high potential voltage VDD, and a power supply line (hereinafter referred to as a cathode line) with the same potential as a low potential voltage VSS. It is to be noted that only wirings arranged in columns in a pixel portion 104 are shown in FIGS. 4A and 4B.

FIG. 4A is a top plan view of a panel comprising a substrate 100. On the substrate 100, the pixel portion 104 in which a plurality of pixels 105 arranged in matrix, a signal line driver circuit 101 arranged at the periphery of the pixel portion 104, and scan line driver circuits 102 and 103 are disposed. The number of driver circuits is not exclusively limited, and may be changed in accordance with a configuration of the pixel 105. Further, the driver circuits are not necessarily formed integrally on the substrate 100, and a driver IC may be attached on the substrate 100 by COG and the like.

A signal line 111 arranged in columns in the pixel portion 104 is connected to the signal line driver circuit 101. Also, power supply lines 112 to 114 arranged in columns are connected to either of anode lines 107 to 109. Similarly, an auxiliary wiring 110 arranged in columns is connected to a cathode line 106. The anode lines 107 to 109 and the cathode line 106 are lead around the pixel portion 104 and the driver circuits arranged at the periphery of the same, and connected to terminals of an FPC.

Each of the anode lines 107 to 109 corresponds to each of RGB. When applying different potentials to each of the anode lines 107 to 109, variations in luminance between each color can be compensated. That is, a problem in that differences in the current density of an electro luminescent layer of a light emitting element in each color cause variations in luminance in each color even when the same current is supplied can be solved by using the plurality of anode lines. It is to be noted that an electro luminescent layer is divided into colors of RGB here, though the invention is not limited to this. When displaying monochrome images or displaying color images by a method in which differences in current density in each pixel are not to be taken in account, for example by using a white light emitting element in combination with a color filter, a plurality of anode lines are not required and a single anode line is sufficient.

FIG. 4B is a diagram showing a mask layout simply. The anode lines 107 to 109 and the cathode line 106 are arranged around the signal line driver circuit 101, and the anode lines 107 to 109 are connected to the power supply lines 112 to 114 arranged in columns in the pixel portion 104. As shown in FIG. 4B, the cathode line 106 and the auxiliary wiring 110 are formed on the same conductive layer.

After forming the cathode line 106 and the auxiliary wiring 110, a first conductive layer (a first electrode) of a light emitting element is formed, and then an insulating layer (also called a bank) is formed thereon. Subsequently, an opening portion is formed in the insulating layer situated on the cathode line 106 and the auxiliary wiring 110. The opening portion exposes the cathode line 106 and the auxiliary wiring 110, and an electro luminescent layer is formed at this time. The electro luminescent layer is selectively formed so as not to cover the opening portion situated on the cathode line 106 and the auxiliary wiring 110. Then, a second conductive layer (a second electrode) is formed so as to cover the whole electro luminescent layer, cathode line 106 and auxiliary wiring 110. According to these steps, the second conductive layer is electrically connected to the cathode line 106 and the auxiliary wiring 110, which is one of the significant features of this embodiment mode. According to this feature, the resistance of the second conductive layer formed so as to cover the electro luminescent layer can be lowered, and therefore, image quality degradation due to the resistance value of the second conductive layer can be prevented. Since the resistance value becomes a problem as a panel is increased in size, such feature is quite effective in manufacturing a large panel having a size of a few tens of inches.

Although the second conductive layer is connected to the cathode line in this embodiment mode, the invention is not limited to this. The second conductive layer may be connected to the anode line, and a counter electrode of the light emitting element is set to be an anode in this case.

Further, the auxiliary wiring 110 is not necessarily formed on the same layer as the signal line arranged in columns as shown in FIGS. 4A and 4B, and may be formed on the same layer as a scan line arranged in rows. An opening portion forming a contact (connection) between the auxiliary wiring 110 and the second conductive layer may be provided in columns either in punctate or linear shapes, or in punctate and linear shapes. It may also be provided in rows either in punctate or linear shapes, or in punctate and linear shapes. Some examples of them are shown hereinafter, and the mask layout thereof is described with reference to FIGS. 5 to 7. It is to be noted that FIGS. 5 to 7 are simplified views in which the pixel 105 includes only a pixel electrode and the power supply line 112 is not shown.

Figure 5:
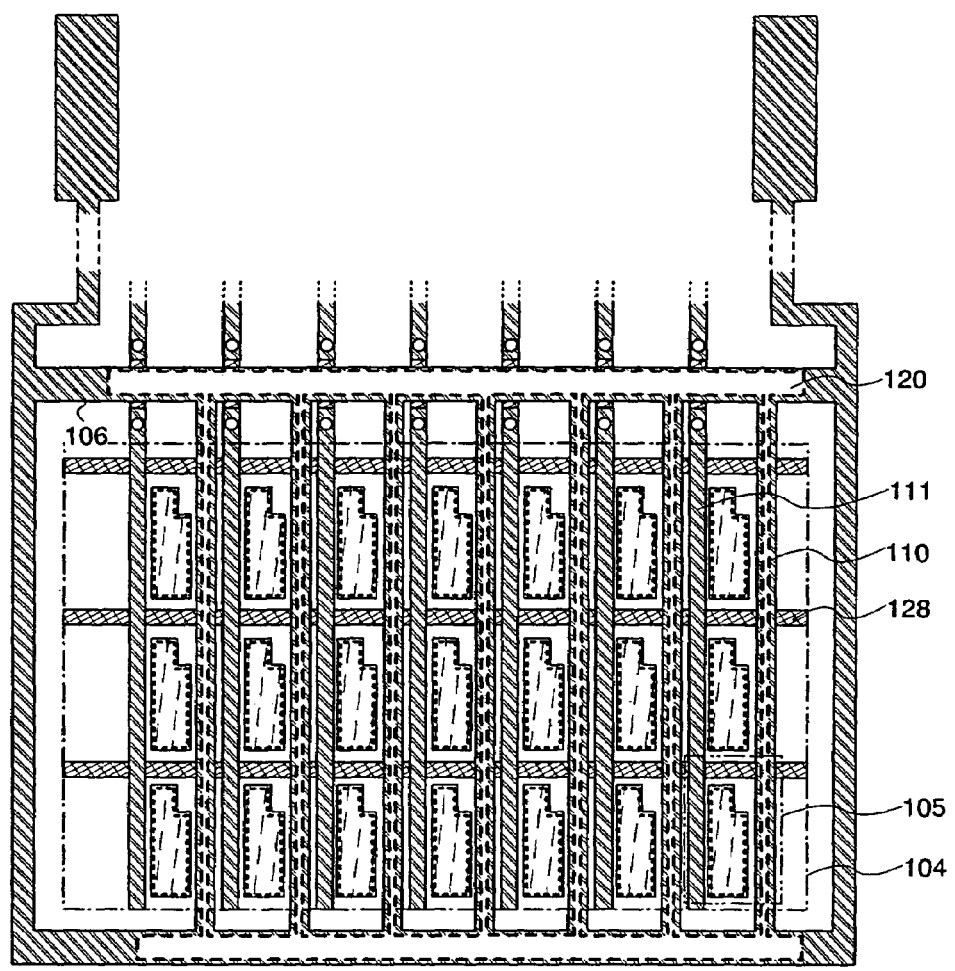
FIG. 5 is a view showing an opening portion and an arrangement of an anode line, a cathode line, and an auxiliary wiring.

With reference to FIG. 5, explanation is made on a structure in which the auxiliary wiring 110 and the signal line 111 are formed on the same conductive layer and the auxiliary wiring 110 is connected to the second conductive layer via an opening portion 120 formed in linear shapes. In FIG. 5, the pixel portion 104 comprises a plurality of pixels 105 arranged in matrix, as well as the signal line 111 and the auxiliary wiring 110 arranged in columns, and a scan line 128 arranged in rows. The auxiliary wiring 110 is connected to the cathode line 106. It is to be noted that although the auxiliary wiring 110 and the cathode line 106 are formed on the same conductive layer, the wiring arranged in the pixel portion 104 is referred to as the auxiliary wiring 110 whereas the wiring arranged in the other areas is referred to as the cathode line 106 herein.

The linear opening portion 120 is formed over the auxiliary wiring 110 and the cathode line 106. The auxiliary wiring 110 and the cathode line 106 are connected to the second conductive layer via the opening portion 120. In this case, the auxiliary wiring 110 is connected to the second conductive layer via the linear opening portion 120.

Figure 6:
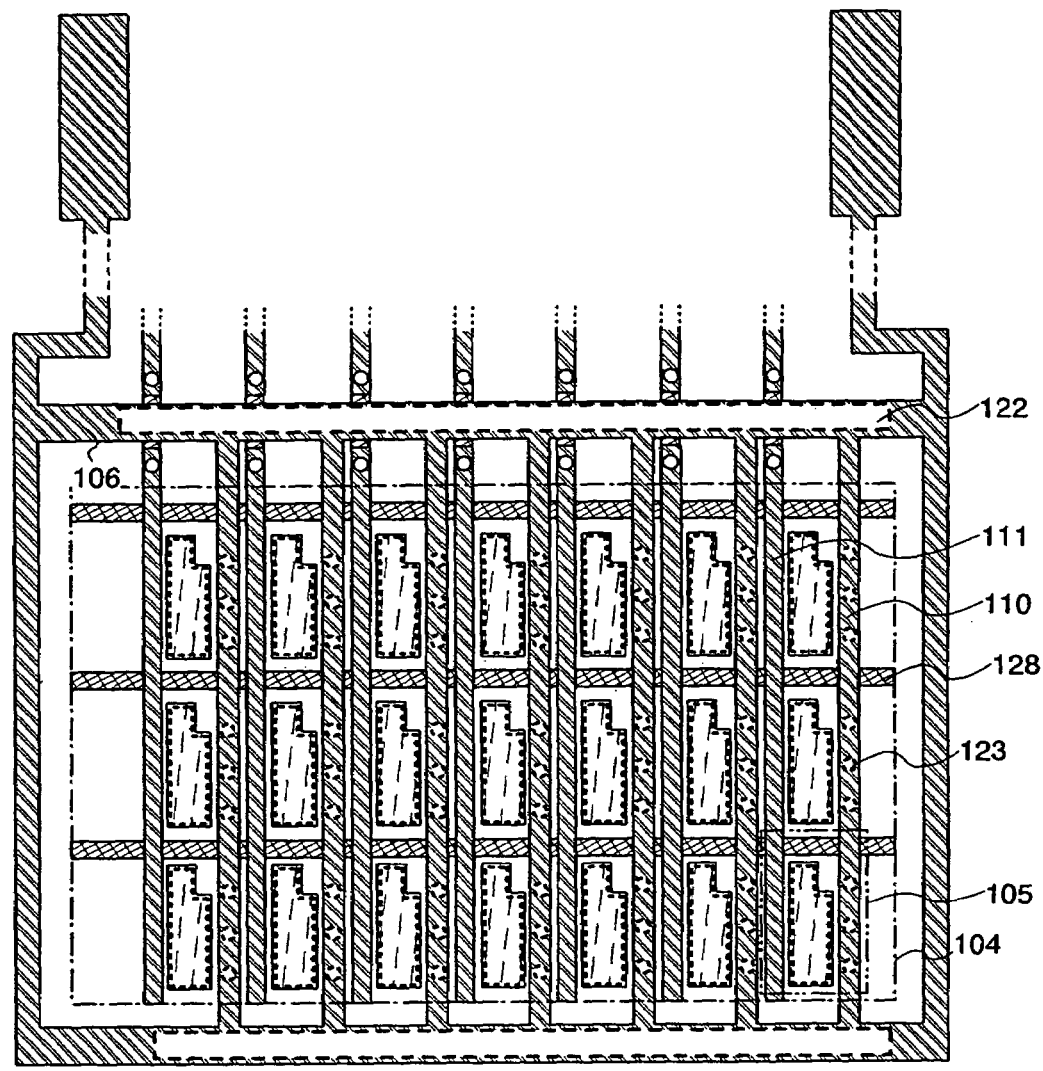
FIG. 6 is a view showing an opening portion and an arrangement of an anode line, a cathode line, and an auxiliary wiring.
Figure 7:
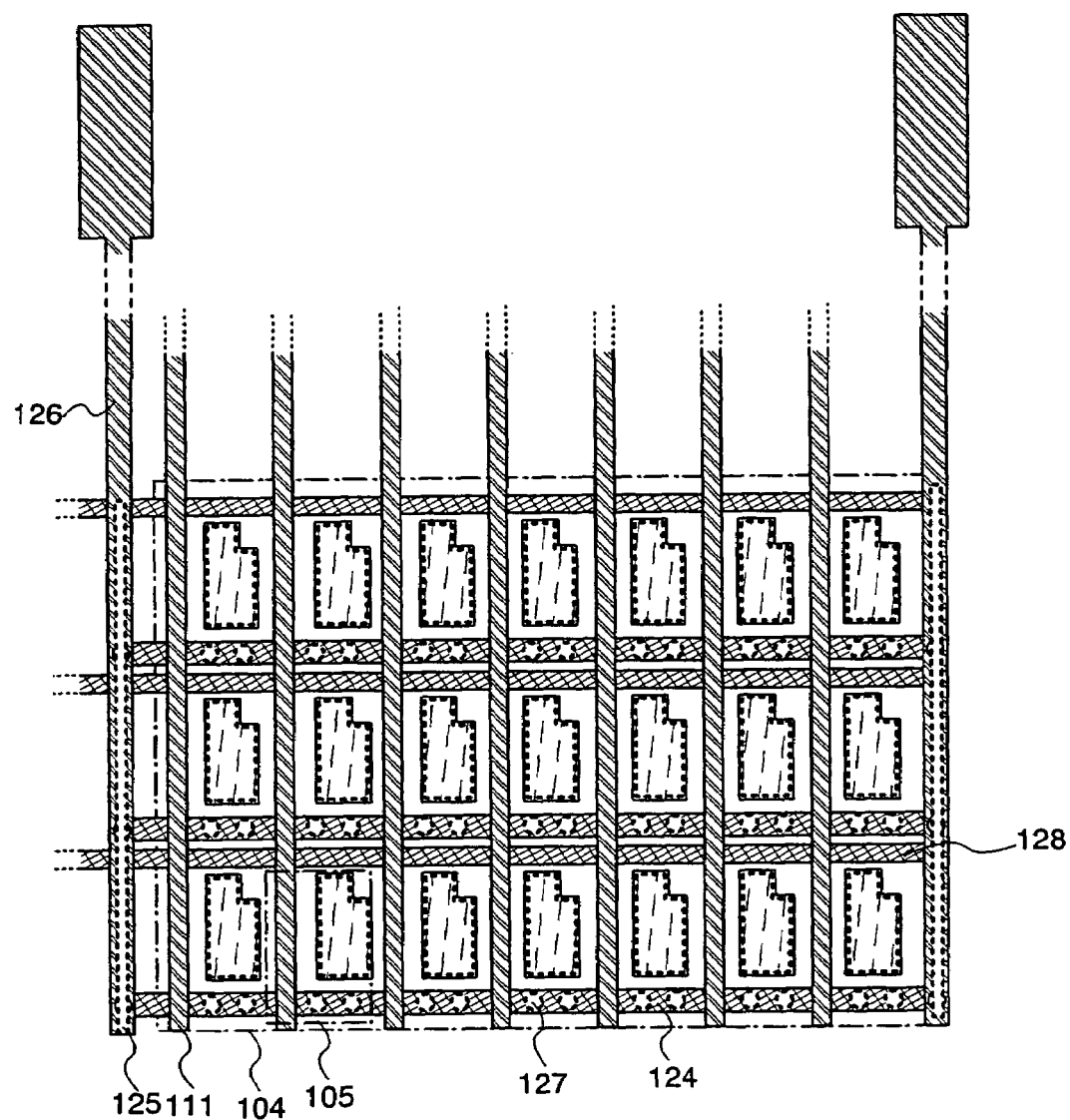
FIG. 7 is a view showing an opening portion and an arrangement of an anode line, a cathode line, and an auxiliary wiring.

With reference to FIG. 6, explanation is hereinafter made on a structure in which a linear opening portion 122 is formed over the cathode line 106 and a punctate opening portion 123 is formed over the auxiliary wiring 110. This structure is different from that shown in FIG. 5 in that the auxiliary wiring 110 is connected to the second conductive layer via the punctate opening portion 123.

With reference to FIG. 7, explanation is hereinafter made on a structure in which an auxiliary wiring 124 and the scan line 128 are formed on the same conductive layer and the auxiliary wiring 124 is connected to the second wiring via a punctate opening portion 127. In FIG. 7, the pixel portion 104 comprises a plurality of pixels 105 arranged in matrix, as well as a signal line 111 arranged in columns, and the scan line 128 and the auxiliary wiring 124 arranged in rows. The auxiliary wiring 124 is connected to a cathode line 126. The auxiliary wiring 124 and the cathode line 126 are formed on different conductive layers and connected to each other via an opening portion.

A linear opening portion 125 is formed over the cathode line 126 and a punctate opening portion 127 is formed over the auxiliary wiring 124. The cathode line 126 and the auxiliary wiring 124 are connected to the second conductive layer via these opening portions 125 and 127. In this case, the auxiliary wiring 124 is connected to the second conductive layer via the punctate opening portion 127.

As described above, the auxiliary wiring may be formed on the same conductive layer as a wiring arranged in columns (e.g., a signal line) as shown in FIGS. 5 and 6, or may be formed on the same conductive layer as a wiring arranged in rows (e.g., a scan line) as shown in FIG. 7. These structures do not require an additional mask and the like, and therefore, the problem such as increase in production costs and drop in reliability can be avoided. Further, in the case where a punctate opening portion forming a contact between the auxiliary wiring and the second conductive layer is arranged at the edge of a pixel, reduction in the aperture ratio can be suppressed resulting in brighter images.

With reference to FIGS. 1A to 1C, 2, and 3A and 3B, explanation is next made on a cross sectional structure and a mask layout of a driving transistor, a light emitting element, and an auxiliary wiring which are provided over a substrate having an insulating surface.

Figure 1A:
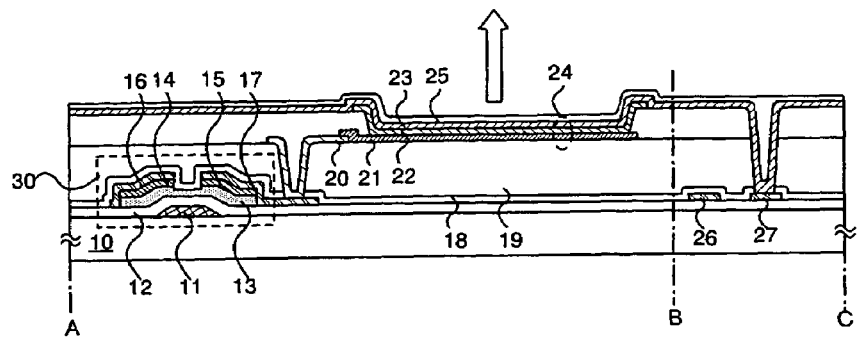
FIGS. 1A to 1C are cross sectional views showing a transistor (channel protected type and channel etched type) using an amorphous semiconductor for a channel portion, a light emitting element, and an auxiliary wiring connected to one electrode of the light emitting element.
Figure 1B:
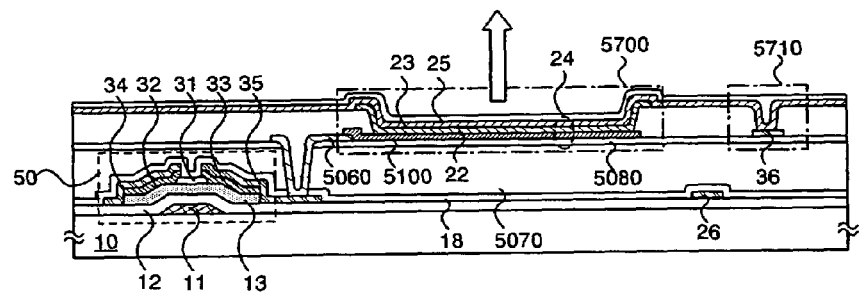
Figure 1C:
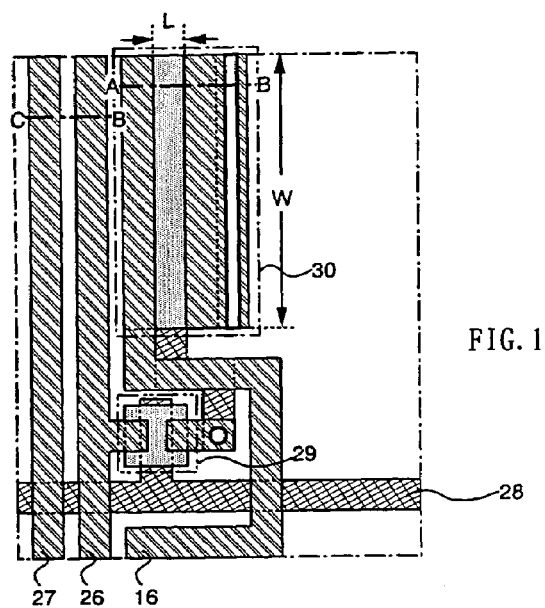

FIG. 1C shows a mask layout of one pixel. In the pixel shown in FIG. 1C, a conductor 16 serving as a power supply line, a conductor 26 serving as a signal line, and a conductor 27 serving as an auxiliary wiring are arranged in columns, and a conductor 28 serving as a scan line is arranged in rows. The pixel further comprises a switching transistor 29 and a driving transistor 30.

FIG. 1A is a cross sectional view along a line A-B-C in the mask layout of FIG. 1C. In FIG. 1A, a gate electrode 11 is formed on a substrate 10 having an insulating surface, and a gate insulating layer 12 is formed thereon. Then, an amorphous semiconductor, an N-type semiconductor, and a conductor are laminated in this order, and then patterned simultaneously to form an amorphous semiconductor 13, N-type semiconductors 14 and 15, and conductors 16 and 17. Subsequently, insulators 18 and 19 are formed, and a conductor 20 is formed after an opening portion is formed in a predetermined area so as to expose the conductor 17 partly.

Then, a conductor 21 (first electrode, pixel electrode), an electro luminescent layer 22, and a conductor 23 (second electrode, counter electrode) are formed so as to be electrically connected to the conductor 20. The overlapping area of the conductor 21, the electro luminescent layer 22, and the conductor 23 corresponds to a light emitting element 24. Afterwards, a protective layer 25 is formed over the whole surface.

Note that, conductors 26 and 27 are formed at the same time as the conductors 16 and 17. The conductors 26 and 27 correspond to a signal line and an auxiliary wiring respectively. By exposing the conductor 27 before forming the conductor 23 (second electrode, counter electrode), the conductor 23 can be laminated on the conductor 27, thereby lowering the resistance of the conductor 23. It is to be noted that the conductor 27 serving as an auxiliary wiring is formed on the same conductive layer as the conductors 16 and 17 in the cross sectional view of FIG. 1A.

FIG. 1B shows a cross sectional structure of a driving transistor 50 and the light emitting element 24. In FIG. 1B, the gate electrode 11 is formed on the substrate 10 having an insulating surface, and the gate insulating layer 12 is formed thereon. After forming the amorphous semiconductor 13, an insulator 31 serving as an etching stopper is formed. Subsequently, an N-type semiconductor and a conductor are laminated in this order, and then patterned simultaneously to form N-type semiconductors 32 and 33 and conductors 34 and 35. Then, insulators 18, 5070, and 5080 are formed, and after an opening portion is formed in a predetermined area so as to expose the conductor 35 partly, a connecting wiring 5060 formed of a conductor is formed. Afterwards, the light emitting element 24 including the conductor 21, the electro luminescent layer 22, and the conductor 23 is formed, and then the protective layer 25 is formed.

Note that, the conductor 26 is formed at the same time as the conductors 34 and 35, and a conductor 36 is formed at the same time as the connecting wiring 5060. The conductor 26 corresponds to a signal line and the conductor 36 corresponds to an auxiliary wiring. By exposing the conductor 36 before forming the conductor 23 (counter electrode), the conductor 23 can be laminated on the conductor 36, thereby lowering the resistance of the conductor 23. It is to be noted that the conductor 36 serving as an auxiliary wiring is formed on the same layer as the conductor 20 in the cross sectional view of FIG. 1B.

Figure 2:
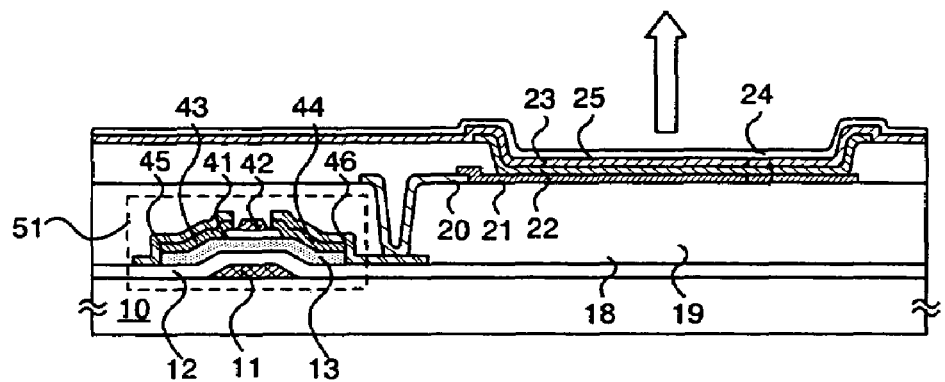
FIG. 2 is a cross sectional view showing a transistor (dual gate type) using an amorphous semiconductor for channel portion, a light emitting element, and an auxiliary wiring connected to one electrode of the light emitting element.

FIG. 2 is a cross sectional view of a driving transistor 51 and the light emitting element 24. In FIG. 2, the gate electrode 11 is formed on the substrate 10 having an insulating surface, and the gate insulating layer 12 is formed thereon. After forming the amorphous semiconductor 13, an insulator 41 serving as an etching stopper is formed, and then a gate electrode 42 is formed. Subsequently, an N-type semiconductor and a conductor are laminated in this order, and patterned simultaneously to form N-type semiconductors 43 and 44 and conductors 45 and 46. Then, the insulators 18 and 19 are formed, and after an opening portion is formed in a predetermined area so as to expose the conductor 46 partly, the conductor 20 is formed. Afterwards, the light emitting element 24 including the conductor 21, the electro luminescent layer 22, and the conductor 23 is formed before forming the protective layer 25. The conductor 36 serving as an auxiliary wiring is electrically connected to the conductor 23.

Figure 3A:
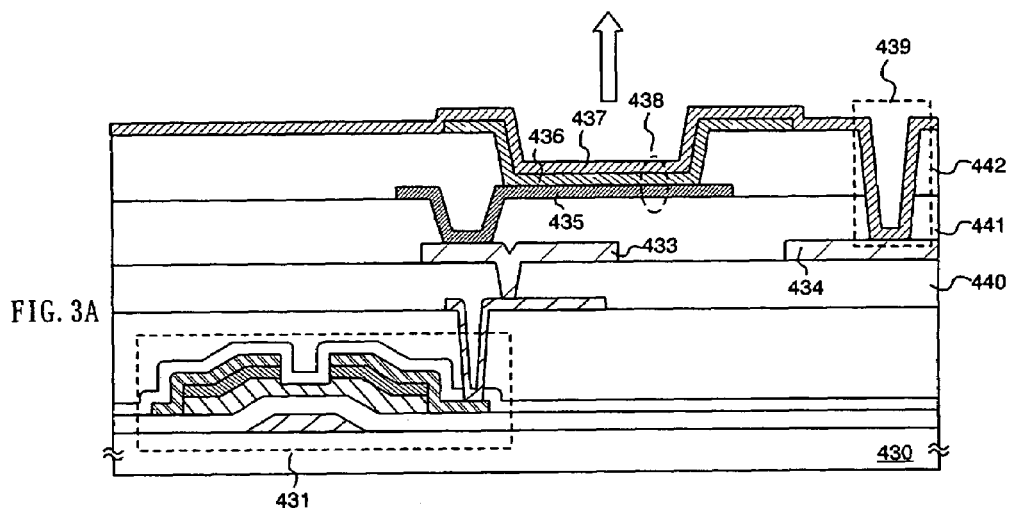
FIGS. 3A and 3B are cross sectional views showing a transistor using an amorphous semiconductor for a channel portion, a light emitting element, and an auxiliary wiring connected to one electrode of the light emitting element.

FIG. 3A is a cross sectional view of a driving transistor 431 and a light emitting element 438. The driving transistor 431 is formed on a substrate 430 having an insulating surface, and an insulator 440 is formed thereon. After forming an opening portion in a predetermined area, conductors 433 and 434 are formed on the insulator 440. Subsequently, a conductor 435 serving as a pixel electrode is formed, and then an insulator 442 is formed. After an opening portion 439 is formed in a predetermined area of the insulators 441 and 442, an electro luminescent layer 436 is formed on the insulator 442 and a conductor 437 serving as a counter electrode is formed thereon. In such a manner, four layers of insulators are laminated in FIG. 3A.

Figure 3B:
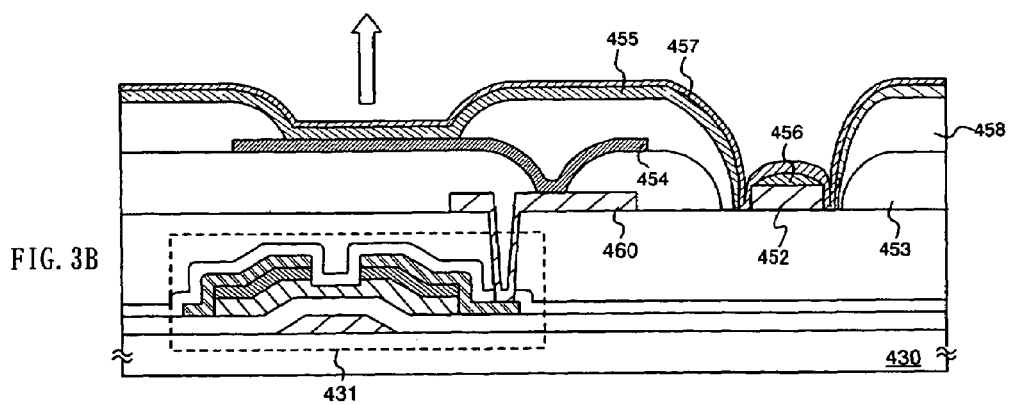

FIG. 3B is a cross sectional view of the driving transistor 431 and a light emitting element 459. The driving transistor 431 is formed on the substrate 430 having an insulating surface, and then an auxiliary wiring 452 and a wiring 460 electrically connected to the driving transistor 431 are formed. After forming an insulator 453, an opening portion is formed in a predetermined area of the insulator 453. Subsequently, a conductor 454 serving as a pixel electrode is formed, an insulator 458 is formed thereon, then, an opening portion is formed in a predetermined area of the insulator 458. Afterwards, electro luminescent layers 455 and 456 are formed on the conductor 454, and a conductor 457 serving as a counter electrode is formed thereon. An overlapping area of the conductor 454, the electro luminescent layers 455 and 457, and the conductor 457 corresponds to the light emitting element 459.

In FIG. 3B, the electro luminescent layer 456 on the auxiliary wiring 452 is formed by vapor deposition and the film thickness thereof is thin, therefore, the sides of the auxiliary wiring 452 are not covered with the electro luminescent layer 456. Taking advantage of this structure, the conductor 457 is electrically connected to the sides of the auxiliary wiring 452.

As shown in FIGS. 1A to 1C, 2, and 3A and 3B, the display device of the invention comprises a light emitting element and a transistor having an amorphous semiconductor. It is preferable that the channel width W/the channel length L of a driving transistor connected in series with the light emitting element is set in the range of 1 to 100 (more preferably, 5 to 20) in order to improve current capacity. Specifically, it is desirable that the channel length L is in the range of 5 to 15 μm and the channel width W is in the range of 20 to 1200 μm (more preferably 40 to 600 μm). Note that, according to the aforementioned channel length L and the channel width W, a transistor occupies larger area of a pixel. Therefore, the light emitting element desirably emits light in the opposite direction of a substrate, namely, top emission.

There are three main types of transistors using an amorphous semiconductor for a channel portion: channel etched type (FIG. 1A, and FIGS. 3A and 3B), channel protected type (FIG. 1B), and dual gate type (FIG. 2). The invention may use any of these.

One of a pair of electrodes included in the light emitting element corresponds to an anode, and the other corresponds to a cathode. The anode and the cathode are preferably formed of metal, alloy, electrical conductor compound, or mixture thereof. Further, a material having a high work function is used for the anode whereas a material having a low work function is used for the cathode. An electro luminescent layer is sandwiched between the anode and the cathode, and formed of at least one material selected from various organic materials or inorganic materials. The luminescence in the electro luminescent layer includes luminescence that is generated when an excited singlet state returns to a ground state (fluorescence) and luminescence that is generated when an exited triplet state returns to a ground state (phosphorescence).

An insulating layer may be formed of either an organic material or an inorganic material. When using an organic material, however, a barrier film such as a silicon nitride film is preferably provided since it has a high hygroscopicity. Among the organic materials, a resist material is inexpensive, has a contact hole with a small diameter, and has a low hygroscopicity as compared with other organic materials such as acryl and polyimide, and thus it requires no barrier film. However, as the resist material is colored, it is preferably used for a top emission display device. Specifically, solution obtained by dissolving cresol resin and the like in solvent (propylene glycol monomethyl ether acetate; PGMEA) is coated by a spinner to form the resist material.

According to the invention adopting the aforementioned structures, variations in characteristics of transistors are reduced, and thus, it is possible to provide a display device in which variations in luminance due to the variations in characteristics of transistors are reduced. Further, according to the invention using an amorphous semiconductor, a large panel ranging in size from a few inches to a few tens of inches can be effectively manufactured, because no crystallizing step and a small number of masks are required, leading to reduction in production costs. In addition, depending on a heat processing temperature in manufacturing steps, an amorphous semiconductor can be formed on a flexible substrate such as plastic, which is light, thin, and inexpensive. Therefore, an application range of the display device can be widened.

The auxiliary wiring contributes to lower a resistance of the second conductive layer, resulting in reduction in power consumption. By disposing the auxiliary wiring, defective writing and gray scale due to wiring resistance can be prevented and drop in voltage can also be suppressed, thereby applying a constant voltage to the light emitting element. Accordingly, a display device with improved image quality can be provided. The structures described in this embodiment mode are effective in manufacturing a large panel having a size of a few tens of inches. This is because the resistance value becomes a problem as a panel is increased in size.

Embodiment Mode 2

An embodiment mode of the invention is described with reference to drawings.

Figure 8A:
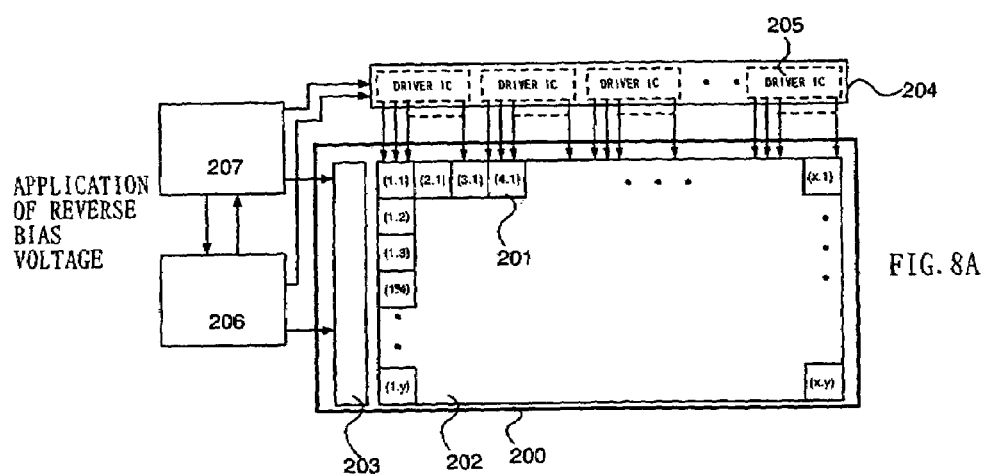
FIGS. 8A and 8B are top plan views of a panel mounting a driver IC.

FIG. 8A is a top plan view of a panel which includes a substrate 200 having an insulating surface. On the substrate 200, a scan line driver circuit 203 and a pixel portion 202 including a plurality of pixels 201 arranged in matrix are formed. A plurality of driver ICs 205 are attached on the substrate 200, and the plurality of driver ICs 205 correspond to a signal line driver circuit 204. The scan line driver circuit 203 and the signal line driver circuit 204 are connected to a power supply circuit 206 and a controller 207.

The power supply circuit 206 supplies power to the panel, and is connected specifically to a power supply line disposed in the pixel portion 202. The power supply line is also referred to as an anode line or a cathode line. The anode line has the same potential as a high potential voltage VDD and the cathode line has the same potential as a low potential voltage VSS. The controller 207 supplies a clock, a clock back, a start pulse, and a video signal to the signal line driver circuit 204 and the scan line driver circuit 203. In the case where the signal line driver circuit 204 includes the plurality of driver ICs 205 as in this embodiment mode, the controller 207 also determines which video signal is supplied to each driver IC, that is, it sorts signals.

Although only a driver circuit on the scan line side is integrally formed on the substrate in FIG. 8A, the invention is not limited to this, and a driver circuit on the signal line side may also be integrally formed on the same substrate depending on the operating frequency of the driver circuit. However, it is preferable that the driver circuit on the scan line side is integrally formed on the substrate and the driver circuit on the signal line side is formed with driver ICs. According to this, the scan line driver circuit and the signal line driver circuit can be operated separately, since the signal line driver circuit is operated at a frequency of 50 MHz or more (for example 65 MHz or more), and the scan line driver circuit is operated at the one hundredth frequency thereof, that is approximately 100 kMHz. In this manner, whether driver circuits are integrally formed on a substrate or driver ICs are attached on a substrate may be selected in accordance with an operating frequency of each driver circuit.

Figure 8B:
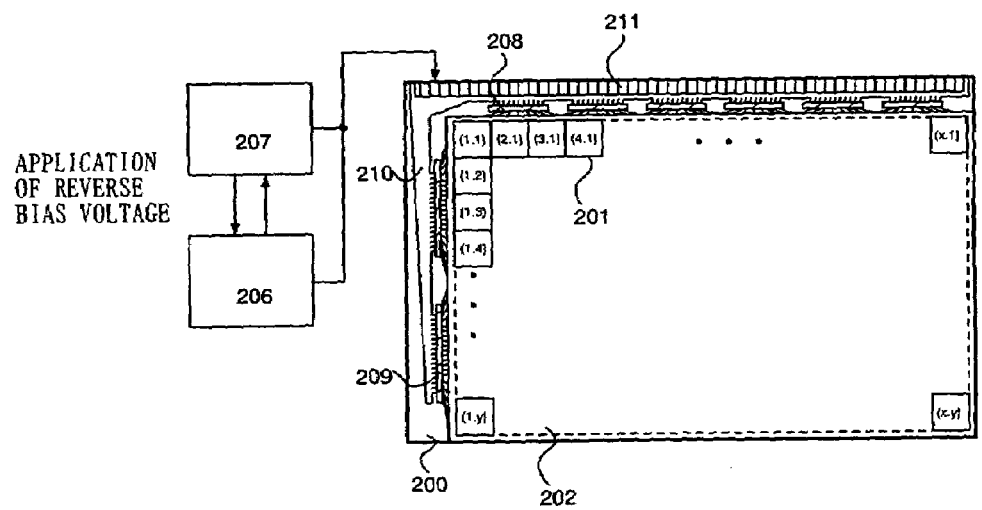

FIG. 8B is a top plan view of a panel which includes the substrate 200 having an insulating surface. The pixel portion 202 including the plurality of pixels 201 arranged in matrix is formed on the substrate 200. A driver IC 209 on a signal line side and a driver IC 208 on a scan line side are attached on the substrate 200 by COG. These driver ICs 208 and 209 are connected to an external input terminal 211 with a connecting wiring 210, and connected to the power supply circuit 206 and the controller 207 via the external input terminal 211. The driver ICs are attached on the substrate by COG in FIG. 8B, though, the invention is not limited to this. The driver ICs may be attached on the substrate by TAB, or connected to the substrate via an FPC instead of attaching thereon. Further, the length of long side and short side of a driver IC is not exclusively limited as well as the number of driver ICs to be mounted.

Each of the pixels 201 comprises a light emitting element including a light emitting material sandwiched between a pair of electrodes, and a transistor whose channel portion is formed of an amorphous semiconductor or an organic semiconductor. A first electrode of the light emitting element is connected to an anode line and a second electrode thereof is connected to a cathode line. According to the invention, potentials of the anode line and the cathode line are switched with each other during a period in which a light emitting element emits no light, and thus a reverse bias voltage is applied to the light emitting element. The timing of applying a reverse bias voltage to the light emitting element is determined by a predetermined signal supplied from the controller 207 to the power supply circuit 206. Therefore, in the invention, the power supply circuit 206 and the controller 207 are collectively referred to as a reverse bias voltage applying circuit.

When the display device of the invention is used for displaying images with multi-level gray scale, time gray scale is applicable. This is because by applying a reverse bias voltage during a period in which a light emitting emits no light, the reverse bias voltage can be applied without affecting gray scale display.

In general, either or both of the anode lines and the cathode lines in all pixels are connected in common. Therefore, a reverse bias voltage has to be applied to all the pixels at the same time. A semiconductor element may thus be added in order to apply a reverse bias voltage to a light emitting element. This semiconductor element corresponds to a transistor or a diode, and allows a reverse bias voltage to be applied arbitrarily, per pixel or per line for example. Specifically, a reverse bias voltage is applied to a light emitting element as soon as the semiconductor element is turned ON. That is, when the semiconductor element is turned ON, the light emitting element is electrically connected to a wiring having a lower potential than that of a counter electrode of the light emitting element, thereby applying a reverse bias voltage to the light emitting element. When the reverse bias voltage is applied, the light emitting element necessarily emits no light. According to the aforementioned structure, however, a reverse bias voltage can be applied to an arbitrary pixel at arbitrary timing, therefore, gray scale display can be performed without any problems. This structure is applicable to other driving methods for performing multi-level gray scale such as analog driving method as well as time gray scale.

According to the invention adopting the structure described above, degradation of a light emitting element with time can be prevented, leading to a display device with an improved reliability and long life elements. This embodiment mode can be implemented in combination with the aforementioned embodiment mode.

Embodiment Mode 3

In this embodiment mode, a cross sectional structure of a CMOS circuit including an N-type transistor whose channel portion is formed of an amorphous semiconductor and a P-type transistor whose channel portion is formed of an organic semiconductor will be described with reference to FIGS. 10A and 10B.

Figure 10A:
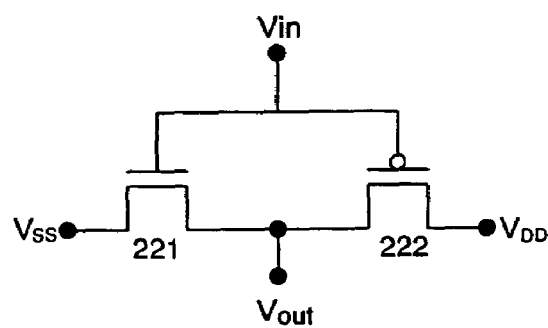
FIG. 10A shows an equivalent circuit.
Figure 10B:
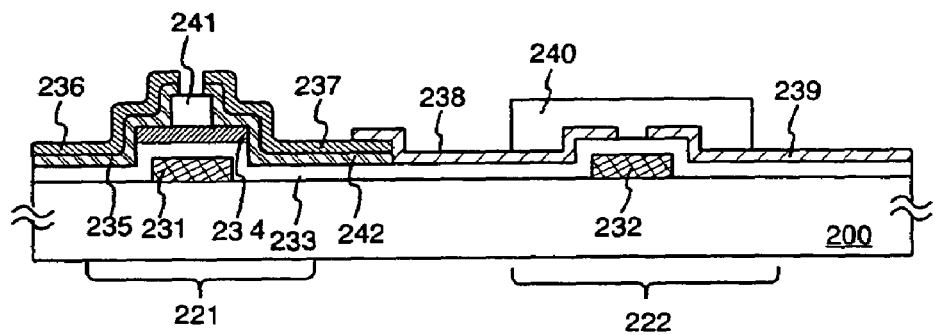
FIG. 10B is a cross sectional view showing a CMOS circuit formed with an organic transistor and an a-Si transistor.

FIG. 10A is an equivalent circuit diagram including a P-type transistor 221 and an N-type transistor 222 which are connected in series, and one terminal of which has the same potential as VDD and the other has the same potential as VSS. FIG. 10B is a cross sectional view of these transistors. In FIG. 10B, conductors 231 and 232 are formed on the substrate 200, and a silicon nitride 233 is formed thereon. Then, an amorphous semiconductor 234 is formed on the silicon nitride 233, and another silicon nitride 241 is formed thereon. On the silicon nitride 241, an N-type semiconductor and a conductor are laminated in this order, and then patterned simultaneously to form N-type semiconductors 235 and 242 and electrodes 236 and 237. Subsequently, electrodes 238 and 239 are formed and an organic semiconductor 240 used as a channel layer is formed thereafter. For the organic semiconductor 240, a low molecular weight organic compound such as pentacene, a high molecular weight organic compound such as PEDOT and PPV, and the like may be used and the pentacene may be patterned by vapor deposition using a metal mask. In such a manner, a CMOS circuit including an N-type transistor whose channel portion is formed of the amorphous semiconductor 234 and a P-type transistor whose channel portion is formed of the organic semiconductor 240 is completed.

The CMOS circuit is a unit circuit of a clocked inverter and the like forming a shift register, a buffer and the like. Therefore, the CMOS circuit may be used for a driver circuit and a pixel circuit, though the CMOS circuit of this embodiment mode is preferably used for a driver circuit at the scan line side because of the operating frequency. Specifically, it is desirable that a driver circuit at the scan line side is formed with the CMOS circuit of this embodiment mode and a driver circuit at the signal line side is formed with a driver IC. Although the driver circuit is formed with the CMOS circuit in this embodiment mode, the invention is not limited to this. It is needless to say that the driver circuit may be formed with either N-type transistors (a-Si:HTFTs) or P-type transistors (organic TFTs) only.

This embodiment mode can be implemented in combination with the aforementioned embodiment modes.

Embodiment Mode 4

The invention provides a display device comprising a plurality of pixels each of which includes a light emitting element having a light emitting material sandwiched between a pair of electrodes, and includes a transistor whose channel portion is formed of an amorphous semiconductor or an organic semiconductor. Explanation is hereinafter made on a configuration of the pixel with reference to FIGS. 11A to 11F.

Figure 11A:
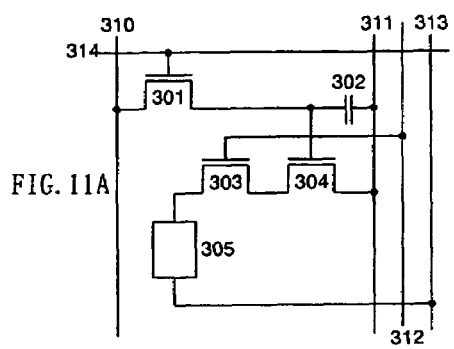
FIGS. 11A to 11F are circuit diagrams of a pixel including a light emitting element and a transistor using an amorphous semiconductor for a channel portion.

In a pixel shown in FIG. 11A, a signal line 310 and power supply lines 311 to 313 are arranged in columns, and a scan line 314 is arranged in rows. The pixel also comprises a transistor 301 for switching, a transistor 303 for driving, a transistor 304 for current controlling, a capacitor 302, and a light emitting element 305.

Figure 11B:
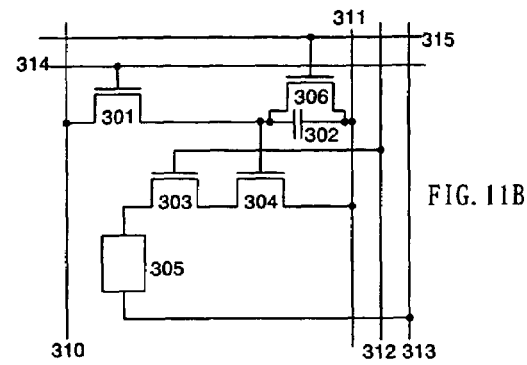
Figure 11C:
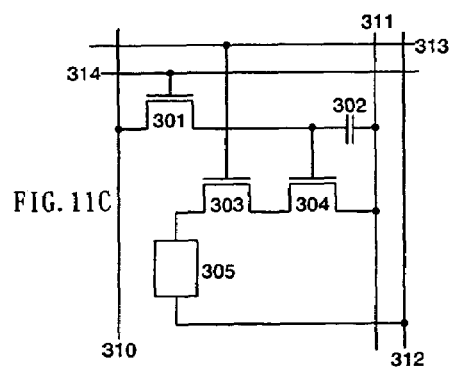
Figure 11D:
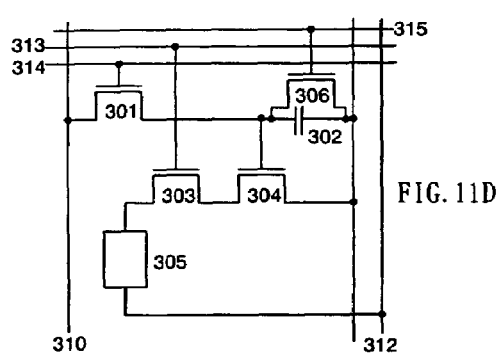
Figure 11E:
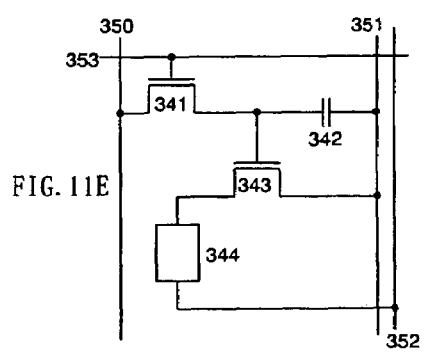
Figure 11F:
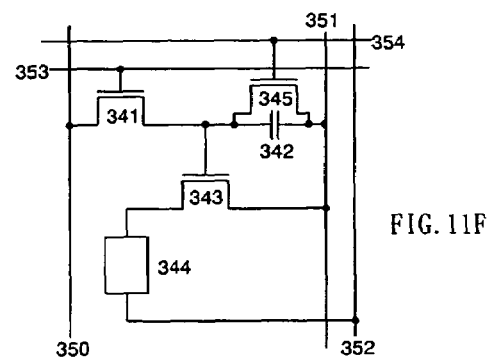

A pixel shown in FIG. 11C has the same configuration as that shown in FIG. 11A, except that a gate electrode of the transistor 303 is connected to the power supply line 313 arranged in rows. That is, both pixels in FIGS. 11A and 11C show the same equivalent circuit diagram. However, the power supply lines are formed on different conductive layers between in the case where the power supply line 313 is arranged in columns (FIG. 11A) and in the case where the power supply line 313 is arranged in rows (FIG. 11C). The two pixels are each shown in FIGS. 11A and 11C in order to make a clear distinction between layers for forming a wiring connected to the gate electrode of the transistor 303 in FIG. 11A and FIG. 1C.

In both FIGS. 11A and 1C, the transistors 303 and 304 are connected in series in the pixel, and the ratio of the channel length $L_3$/the channel width $W_3$ of the transistor 303 to the channel length $L_4$/the channel width $W_4$ of the transistor 304 is set as $L_3/W_3$: $L_4/W_4$=5 to 6000:1. For example, when $L_3$, $W_3$, $L_4$, and $W_4$ are equal to 500 μm, 3 μm, 3 μm, and 100 μm respectively, $L_3/W_3$: $L_4/W_4$ can be set 6000:1.

The transistor 303 is operated in a saturation region and controls the amount of current flowing in the light emitting element 305, whereas the transistor 304 is operated in a linear region and controls whether a current is supplied to the light emitting element 305 or not. These transistors 303 and 304 preferably have the same conductivity in view of the manufacturing step. For the transistor 303, a depletion mode transistor may be used as well as an enhancement mode transistor. According to the invention having the aforementioned structure, a slight variation in $V_{GS}$ of the transistor 304 does not affect the amount of current flowing in the light emitting element 305, since the transistor 304 is operated in a linear region. That is, the amount of current flowing in the light emitting element 305 is determined by the transistor 303 operated in a saturation region. Accordingly, it is possible to provide a display device in which variations in luminance due to variations in characteristics of transistors are reduced and image quality is improved.

The transistor 301 in FIGS. 11A to 11D controls a video signal input to the pixel. When the transistor 301 is turned ON and a video signal is inputted to the pixel, the video signal is held in the capacitor 302. Although the pixel comprises the capacitor 302 in FIGS. 11A to 11D, the invention is not limited to this. When a gate capacitor and the like can replace the capacitor in holding a video signal, the capacitor 302 is not necessarily provided.

The light emitting element 305 comprises an electro luminescent layer sandwiched between a pair of electrodes. A pixel electrode and a counter electrode (anode and cathode) have a potential difference in order that a forward bias voltage is applied to the light emitting element 305. The electro luminescent layer is formed of at least one material selected from various organic materials or inorganic materials. The luminescence in the electro luminescent layer includes luminescence that is generated when an excited singlet state returns to a ground state (fluorescence) and luminescence that is generated when an excited triplet state returns to a ground state (phosphorescence).

A pixel shown in FIG. 11B has the same configuration as that shown in FIG. 11A, except that a transistor 306 and a scan line 315 are added. Similarly, a pixel shown in FIG. 11D has the same configuration as that shown in FIG. 11C, except that the transistor 306 and the scan line 315 are added.

The transistor 306 is controlled to be ON/OFF by the added scan line 315. When the transistor 306 is turned ON, charges held in the capacitor 302 are discharged, thereby turning the transistor 304 OFF. That is, supply of a current to the light emitting element 305 can be forcibly stopped by disposing the transistor 306. Accordingly, by adopting the configurations shown in FIGS. 11B and 11D, a lighting period can start simultaneously with or shortly after a writing period before signals are written to all the pixels, leading to increased duty ratio.

In a pixel shown in FIG. 1E, a signal line 350 is arranged in columns, and power supply lines 351 and 352 and a scan line 353 are arranged in rows. The pixel further comprises a switching transistor 341, a driving transistor 343, a capacitor 342, and a light emitting element 344. A pixel shown in FIG. 11F has the same configuration as that shown in FIG. 11E, except that a transistor 345 and a scan line 354 are added. It is to be noted that the configuration of FIG. 11F also allows the duty ratio to be increased due to the transistor 345.

This embodiment mode can be implemented in combination with the aforementioned embodiment modes.

Embodiment 1

A light emitting element including a light emitting material between a pair of electrodes and a transistor including an amorphous semiconductor or an organic semiconductor are essential elements of the invention, and the light emitting element and the transistor are provided in each pixel. When a transistor including an amorphous semiconductor is provided in each pixel as in this case, a driver IC is usually mounted on a substrate by COG or TAB, or connected to a substrate via an FPC. Described hereinafter is an embodiment in which a plurality of driver ICs are formed on a rectangular substrate and mounted on a substrate.

Figure 9A:
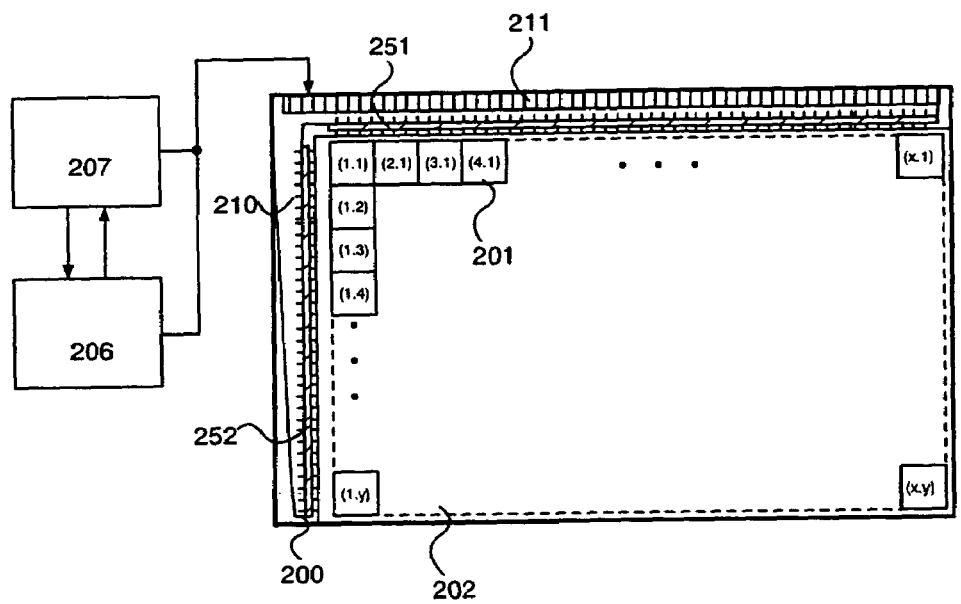
FIG. 9A is a top plan view of a panel mounting a linear driver IC, and 9B is a perspective view of the same.

FIG. 9A is a top plan view of a panel which includes driver ICs 251 and 252 on a scan line side and a signal line side, respectively. Other elements are the same as that of the panel shown in FIG. 8B, the explanation is therefore omitted herein.

Figure 9B:
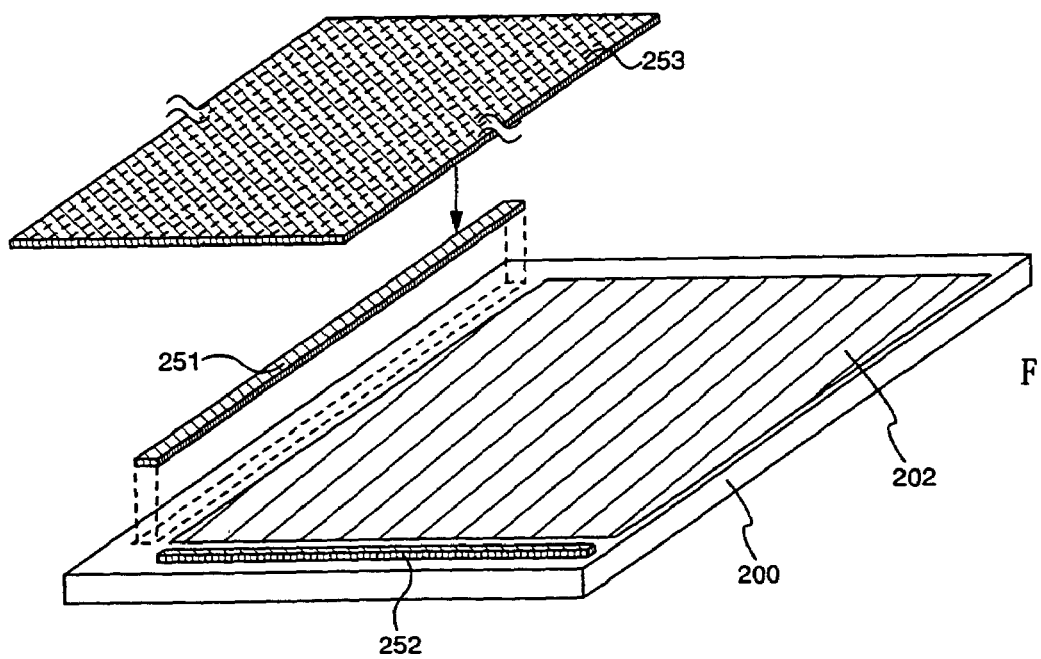

FIG. 9B is a perspective view showing a driver IC attached on a substrate. A plurality of driver circuits and input and output terminals for connecting the plurality of driver circuits are formed on a substrate 253. When the substrate 253 is separated into stripes or rectangles using each driver circuit and corresponding input and output terminals as a unit, a plurality of driver ICs are obtained. Then, the driver ICs are attached on the substrate 200 to complete a display device. In FIG. 9B, the driver IC 252 serving as a scan line driver circuit and the driver IC 251 serving as a signal line driver circuit are mounted on the substrate.

It is preferable that signal lines and scan lines have the same pitch as the output terminals of the driver ICs. According to this, it is not necessary to provide a lead wiring for every few blocks at the end of the pixel portion 202, leading to improved yield in manufacturing steps. Further, by forming the driver ICs on the rectangular substrate 253, they can be produced in large quantities, leading to enhanced productivity. Therefore, as the substrate 253, a large substrate, for example, a substrate having a side of about 300 to 1000 mm in length is preferably used. This provides a great advantage as compared with the case where the IC chips are formed on a circular silicon wafer. Moreover, when the substrate 253 is separated so that the long side of the driver IC has the same length as the vertical or the horizontal direction of the pixel portion 202, the number of driver ICs can be reduced and the reliability can be improved.

These driver ICs are preferably formed of a crystalline semiconductor, and the crystalline semiconductor is preferably obtained by irradiating continuous wave laser light. Thus, as an oscillator generating the laser light, either a continuous wave solid-state laser or a continuous wave gas laser is desirably used. When irradiating continuous wave laser light, a crystal grain boundary extends in the scanning direction of the laser light. Taking advantage of such characteristics, a semiconductor layer is patterned so that the crystal grain boundary direction is parallel to the channel length direction. Thus, a thin film transistor using a crystalline semiconductor having enough electrical characteristics as an active layer can be achieved.

It is preferable that a driver IC disposed in a signal line side and that disposed in a scan line side have different structures, and specifically, they are different in the thickness of a gate insulating layer of a thin film transistor. It is thus possible to independently operate the signal (data) line driver circuit and the scan line driver circuit. Specifically, in a thin film transistor forming the signal line driver circuit, the thickness of a gate insulating layer is set 20 to 70 nm and the channel length is set 0.3 to 1 μm. On the other hand, in a thin film transistor forming the scan line driver circuit, the thickness of a gate insulating layer is set 150 to 250 nm and the channel length is set 1 to 2 μm. In such a manner, a display device comprising driver ICs each of which has an operating frequency corresponding to each driver circuit can be achieved. This embodiment mode can be implemented in combination with the aforementioned embodiment modes.

Embodiment 2

A light emitting element including a light emitting material between a pair of electrodes and a transistor including an amorphous semiconductor or an organic semiconductor are essential elements of the invention, and the light emitting element and the transistor are provided in each pixel. In such a transistor including an amorphous semiconductor, electrical characteristics (threshold voltage, field effect mobility and the like) are varied with time. Thus, a threshold compensation circuit is hereinafter described, referring to a threshold voltage.

A threshold compensation circuit is explained with reference to FIGS. 17A to 17D. FIG. 17A is an equivalent circuit which includes switches 531 and 532 formed with transistors and the like, a transistor 533, and a capacitor 534. The operation of this circuit is briefly described.

When the switches 531 and 532 are turned ON (FIG. 17A), a current $I_{ds}$ is supplied from the switch 531 to the transistor 533 and from the switches 531 and 532 to the capacitor 534. The $I_{ds}$ is divided into $I_1$ and $I_2$, and $I_{ds}=I_1+I_2$ is satisfied. When the current starts flowing, charges are not held in the capacitor 534, the transistor is turned OFF, and thus, $I_2=0$ and $I_{ds}=I_1$ are satisfied. However, as the charges are held in the capacitor 534, potentials between two electrodes of the capacitor 534 starts differing. When potential difference between the electrodes is equal to $V_{th}$, a transistor 533 is turned ON, and $I_2$ is more than 0. Since $I_{ds}=I_1+I_2$ is satisfied at this time, $I_1$ is decreased gradually, though the current continues to flow. The capacitor 534 continues to hold charges until the potential difference between the electrodes is equal to $V_{dd}$. When the potential difference between the electrodes is equal to $V_{dd}$, $I_2$ stops flowing, and as the transistor 533 is turned ON, $I_{ds}=I_1$ is satisfied (FIGS. 17C and 17D, point A).

Subsequently, the switch 531 is turned OFF (FIG. 17B). Thus, the charges held in the capacitor 534 flow in the direction of the transistor 533 via the switch 532 to be discharged. This operation continues until the transistor 533 is turned OFF. That is, the capacitor 534 holds charges having the same potential as a threshold voltage of the transistor 533 (FIGS. 17C and 17D, point B).

In this manner, potential difference between two electrodes of a capacitor can be set the same as a threshold voltage of a transistor. A signal voltage is inputted to a gate electrode of the transistor while holding $V_{GS}$ of the transistor. Thus, the $V_{GS}$ held in the capacitor added to the signal voltage is inputted to the gate electrode of the transistor. In other words, even when there are variations in threshold voltages of transistors, a signal voltage and a threshold voltage of a transistor are constantly inputted to the transistor. Therefore, variations in threshold voltages of transistors can be reduced.

By using the threshold compensation circuit, variations in threshold voltages of driving transistors for driving a light emitting element can be reduced, variations in luminance due to such variations in threshold voltages can also be reduced, and a display device with improved image quality can be achieved. It is to be noted that the threshold compensation circuit of this embodiment mode can be applied to the pixel circuits-shown in FIGS. 11A to 11F. In this case, the threshold compensation circuit may be provided so as to compensate a threshold voltage of a driving transistor having a gate electrode to which a signal voltage is inputted.

Although a compensator for a threshold voltage is shown as an example in this embodiment, the invention may comprise a compensator for other electrical characteristics. For example, a compensator for field effect mobility may be provided. This embodiment can be implemented in combination with the aforementioned embodiment modes and embodiment.

Embodiment 3

In order to form a light emitting element, a hole injecting layer, a hole transporting layer, a hole blocking layer, an electron transporting layer and the like are arbitrarily combined. Though, an electron injecting layer is preferably formed of bathocuproine (BCP) known as a material suitable for transporting only electrons, which is doped with lithium (Li), since electron injection property can be drastically improved when bathocuproine is doped with lithium.

Further, benzoxazole derivative (BzOS) and pyridine derivative are materials which have excellent electron transport property and are not crystallized easily when deposited. In addition, these materials can have excellent electron injection property when containing at least one of alkaline metal, alkaline earth metal, and transition metal. Therefore, in a light emitting element comprising a light emitting material between a pair of electrodes, a part of layers included in the light emitting material is preferably formed of benzoxazole derivative or pyridine derivative.

That is, when an electron injecting layer is formed of an electron injection property composition for light emitting element including either benzoxazole derivative or pyridine derivative and at least one of alkaline metal, alkaline earth metal, and transition metal, electrons can be injected more easily from an electrode functioning as a cathode. Moreover, as pyridine derivative is not efficiently crystallized when deposited, a light emitting element having superior characteristics and longer life than ever before can be provided as well as a display device using the same. This embodiment can be implemented in combination with the aforementioned embodiment modes and embodiments.

Embodiment 4

In this embodiment, a laminated structure of a light emitting element is described. It is to be noted that the description is performed herein with reference to enlarged views of areas 5700 and 5710 surrounded by a dotted line in FIG. 1B. FIGS. 18A, 18C, and 19A correspond to enlarged views of the area 5700, and FIGS. 18B, 18D, and 19B correspond to enlarged views of the area 5710. A cross sectional structure of FIG. 1B and cross sectional structures of FIGS. 18A to 18D and FIGS. 19A and 19B are the same in that they comprise the insulators 5070 and 5080, the connecting wiring 5060, and a pixel electrode 5100, but they are different in other elements which will be described hereinafter by the use of different reference numerals.

In FIGS. 18A and 18B, the insulator 5080 is formed on the insulator 5070, and the connecting wiring 5060 is formed thereon. The connecting wiring 5060 is electrically connected to either a source electrode or a drain electrode of a driving transistor. On the insulator 5080, an auxiliary wiring 5200 obtained by patterning the same conductor as the connecting wiring 5060 is also formed. Then, the pixel electrode 5100 is formed so as to be connected with the connecting wiring 5060, and on the pixel electrode 5100, a hole injecting layer 5110, a light emitting layer 5120, and an electron injecting layer 5130 are laminated in this order. Finally, a protective layer 5240 is formed. An overlapping area of the pixel electrode 5100, the hole injecting layer 5110, the light emitting layer 5120, and the electron injecting layer 5130 corresponds to a light emitting element 5140.

The light emitting layer 5120 is formed by using a metal mask so as to expose a part of the auxiliary wiring 5200 while not covering an opening portion entirely. Accordingly, in the opening portion, the hole injecting layer 5110 and the electron injecting layer 5130 are laminated in this order on the auxiliary wiring 5200. Note that, the invention is not limited to this structure, and only the electron injecting layer 5130 may be on the auxiliary wiring 5200 by forming the hole injecting layer 5110 and the light emitting layer 5120 by means of a metal mask.

Although light from the light emitting element 5140 is emitted in the direction of the substrate in FIGS. 18A and 18B, the structure in which the light is emitted in the opposite direction of the substrate may also be adopted.

In FIGS. 18C and 18D, the pixel electrode 5100 is formed so as to be connected with the connecting wiring 5060. On the pixel electrode 5100, the hole injecting layer 5110, the light emitting layer 5120, the electron injecting layer 5130, and a transparent conductive layer 5800 are laminated in this order. Finally, the protective layer 5240 is formed. The transparent conductive layer 5800 formed so as to be in connect with the electron injecting layer 5130 suppresses drop in voltage even when the electron injecting layer 5130 serving as a counter electrode has increased resistance.

The light emitting layer 5120 is formed by means of a metal mask so as to expose a part of the auxiliary wiring 5200 while not covering an opening portion entirely. Accordingly, in the opening portion, the hole injecting layer 5110, the electron injecting layer 5130, and the transparent conductive layer 5800 are laminated in this order on the auxiliary wiring 5200. It is to be noted that the invention is not limited to this structure, and only the electron injecting layer 5130 and the transparent conductive layer 5800 may be formed on the auxiliary wiring 5200 by forming the hole injecting layer 5110 and the light emitting layer 5120 by means of a metal mask. Alternatively, only the transparent conductive layer 5800 may be formed on the auxiliary wiring 5200 by forming the hole injecting layer 5110, the light emitting layer 5120, and the electron injecting layer 5130 by means of a metal mask.

The protective layer 5240 shown in FIGS. 18A and 18B may have a laminated structure of an inorganic insulating layer and an organic insulating layer. A cross sectional structure in this case is described with reference to FIGS. 19A and 19B.

In FIGS. 19A and 19B, the protective layer 5240 has a laminated structure in which an inorganic insulating layer 5240a is formed so as to be in contact with the electron injecting layer 5130, and an organic resin layer 5240b and an inorganic insulating layer 5240c are laminated in this order on the inorganic insulating layer 5240a. When the inorganic insulating layers 5240a and 5240c are formed of silicon nitride, silicon nitride oxide, aluminum oxide, aluminum nitride or the like, moisture and oxygen can be prevented from being absorbed in the light emitting element 5140 and accelerating the degradation thereof. Further, the organic resin layer 5240b with less internal stress provided between the inorganic insulating layer 5240a and the inorganic insulating layer 5240c can prevent the protective layer 5240 from being peeled off by stress. For the organic resin layer 5240b, polyimide, polyamide, polyimide amide or the like may be used.

The light emitting layer 5120 is formed by using a metal mask so as to expose a part of the auxiliary wiring 5200 while not covering an opening portion entirely. Accordingly, in the opening portion, the hole injecting layer 5110, the electron injecting layer 5130, the inorganic insulating layer 5240a, the organic resin layer 5240b, and the inorganic insulating layer 5240c are laminated in this order on the auxiliary wiring 5200. It is to be noted that the invention is not limited to this structure, and by forming the hole injecting layer 5110 and the light emitting layer 5120 by means of a metal mask, the electron injecting layer 5130, the inorganic insulating layer 5240a, the organic resin layer 5240b, and the inorganic insulating layer 5240c may be laminated in this order on the auxiliary wiring 5200. This embodiment can be implemented in combination with the aforementioned embodiment modes and embodiments.

Embodiment 5

A light emitting element including a light emitting material between a pair of electrodes and a transistor including an amorphous semiconductor or an organic semiconductor are essential elements of the invention, and the light emitting element and the transistor are provided in each pixel. In the case of providing such a transistor in each pixel, a driver circuit formed on the same substrate is also preferably formed with transistors including an amorphous semiconductor or an organic semiconductor. However, a transistor including an amorphous semiconductor can not be applied to a P-type transistor. In this embodiment, a shift register formed only with N-type transistors will thus be described.

In FIG. 12A, a block denoted by 400 corresponds to a pulse output circuit for outputting sampling pulses of one stage. A shift register is formed with n pulse output circuits. FIG. 12B shows a specific configuration of the pulse output circuit 400, which includes N-type transistors 401 to 406 and a capacitor 407. The pulse output circuit 400 can be made only with the N-type transistors by applying the bootstrap method. The operation is disclosed in detail in Japanese Patent Laid-Open No. 2002-335153.

Although the driver circuit is made only with N-type transistors in this embodiment, the invention is not limited to this. A P-type transistor whose channel portion includes an organic semiconductor may be used for forming the driver circuit. This embodiment can be implemented in combination with the aforementioned embodiment modes and embodiments.

Embodiment 6

In the case where the display device of the invention is operated by digital driving method, time gray scale is preferably used for displaying images with multi-level gray scale. In this embodiment, the time gray scale is described. FIG. 13A is a timing chart whose ordinate represents scan lines and abscissa represents time. FIG. 13B is a timing chart of a scan line of j-th row.

The display device has a frame frequency of approximately 60 Hz herein. Namely, writing of image is performed 60 times per second, and a period of one writing image is referred to as a frame period. In the time gray scale, a frame period is divided into a plurality of subframe periods. The number of divisions is equal to the number of bits in many cases, and such a case is described herein for simplicity. That is, as 5-bit gray scale is shown as an example in this embodiment, a frame period is divided into five subframe periods SF1 to SF5. Each subframe period comprises an address period Ta for writing a video signal to a pixel, and a sustain period Ts for lighting or non-lighting of the pixel. The ratio of the sustain periods Ts1 to Ts5 is set as Ts1: . . . :Ts5=16:8:4:2:1. In other words, when displaying an image with n-bit gray scale, the ratio of the sustain periods is $2^{(n-1)}:2^{(n-2)}: \ldots :2^1:2^0$.

A subframe period having a shorter lighting period than a writing period (the subframe period SF5 herein) has an erasing period Te5. During the erasing period Te5, a video signal which has been written to a pixel is reset and a light emitting element is forcibly reset in order that the next period does not start shortly after a lighting period.

When the number of bits has to be increased, the number of subframes may be increased. The order of subframe periods is not necessarily arranged from the most significant bit to the least significant bit, and it may be arranged at random in a frame period. Further, the order of subframe periods may be changed per frame period. This embodiment can be implemented in combination with the aforementioned embodiment modes and embodiments.

Embodiment 7

In this embodiment, a configuration example of a signal line driver circuit and a scan line driver circuit is described with reference to FIGS. 14A and 14B.

Figure 14A:
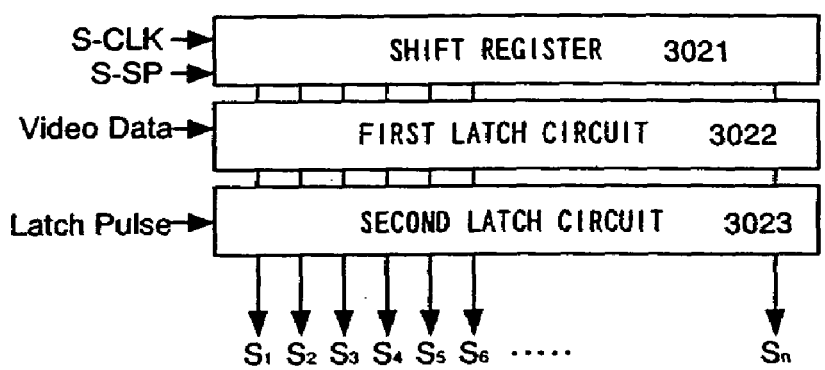
FIGS. 14A and 14B are diagrams showing a configuration of a signal line driver circuit and a scan line driver circuit.
Figure 14B:
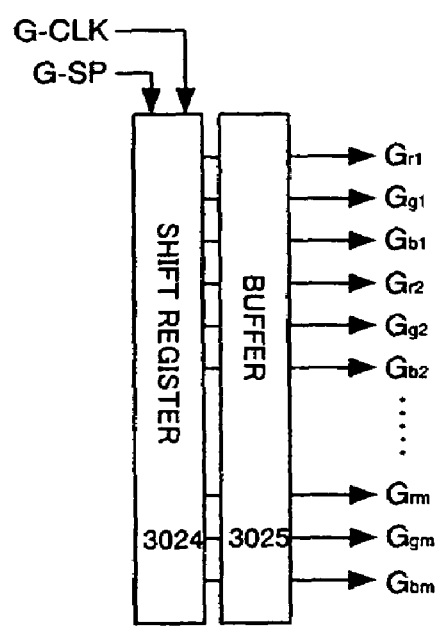

As shown in FIG. 14A, a signal line driver circuit comprises a shift register 3021, a first latch circuit 3022, and a second latch circuit 3023. Meanwhile, as shown in FIG. 14B, a scan line driver circuit comprises a shift register 3024 and a buffer 3025. The configurations in FIGS. 14A and 14B are just examples. For example, a level shifter or a buffer may be added to the signal line driver circuit, and a level shifter may be disposed between the shift register 3024 and the buffer 3025 in the scan line driver circuit. By adding the level shifter, voltage amplitude of a logic circuit portion and a buffer portion can be changed. This embodiment can be implemented in combination with the aforementioned embodiment modes and embodiments.

Embodiment 8

The invention can be applied to various electronic apparatuses such as a video camera, a digital camera, a goggle type display, a navigation system, an audio reproducing device such as a car audio system, a notebook personal computer, a game machine, a portable information terminal (a mobile computer, a mobile phone, a portable game machine, an electronic book and the like), an image reproducing device provided with a recording medium, such as a home video game machine (specifically, a device which is capable of reproducing a recording medium such as a DVD and has a display for displaying the reproduced image). The specific examples of such electronic apparatuses are shown in FIGS. 15A to 15D and 16A to 16D.

Figure 15A:
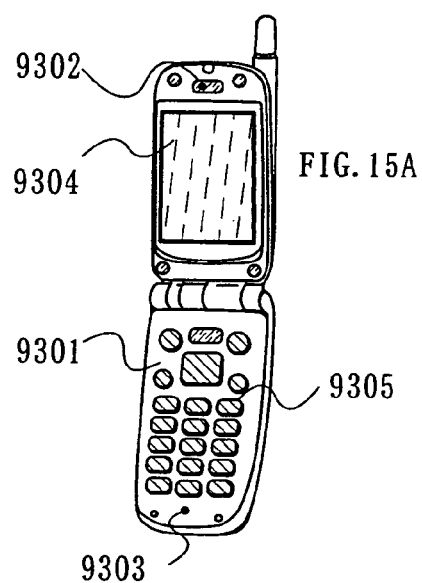
FIGS. 15A to 15D are views showing electronic apparatuses using the invention.
Figure 15B:
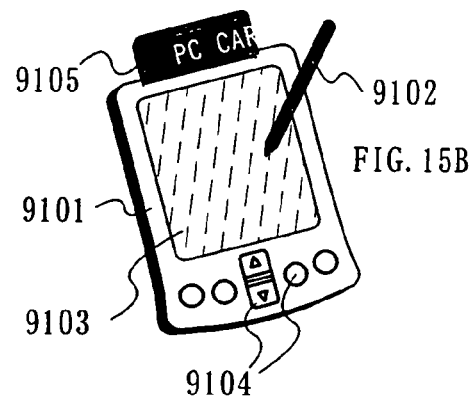
Figure 15C:
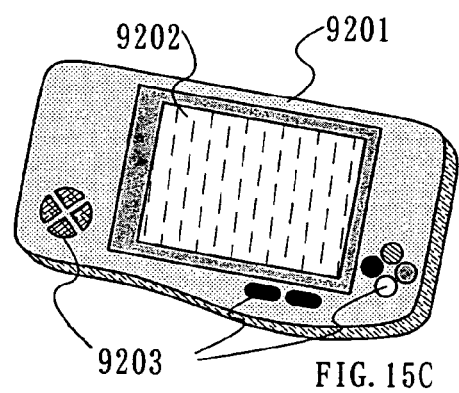
Figure 15D:
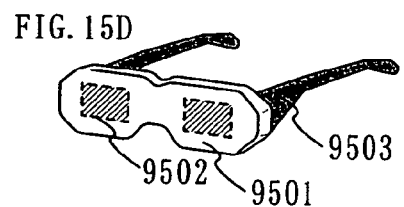

FIG. 15A shows a portable terminal which includes a main body 9301, an audio output portion 9302, an audio input portion 9303, a display portion 9304, an operation switch 9305 and the like. FIG. 15B shows a PDA which includes a main body 9101, a stylus 9102, a display portion 9103, operation keys 9104, an external interface 9105 and the like. FIG. 15C shows a portable game machine which includes a main body 9201, a display portion 9202, operation keys 9203 and the like. FIG. 15D shows a goggle type display which includes a main body 9501, a display portion 9502, an arm portion 9503 and the like.

FIG. 16A shows a large liquid crystal television having a size of about 40 inches, which includes a display portion 9401, a housing 9402, an audio output portion 9403 and the like. FIG. 16B shows a monitor which includes a housing 9601, an audio output portion 9602, a display portion 9603 and the like. FIG. 16C-shows a digital camera which includes display portions 9701 and 9702 and the like. FIG. 16D shows a notebook personal computer which includes a housing 9801, a display portion 9802, a keyboard 9803 and the like.

In the aforementioned electronic apparatuses, the display device of the invention can be applied to a panel including the display portions 9304, 9103, 9202, 9502, 9401, 9603, 9701, 9702, and 9802. This embodiment can be implemented in combination with the aforementioned embodiment modes and embodiments.

Embodiment 9

In this embodiment, a layout example of the pixel circuit described in Embodiment 4 is explained. A layout example described hereinafter includes a pixel electrode of a light emitting element and an insulating layer surrounding an end portion of the pixel electrode. In layout examples shown in FIGS. 21 to 23, three pixels adjacent to each other are shown, and one of the pixels shows a layout shortly after forming a transistor and a capacitor, another pixel shows a layout shortly after forming a pixel electrode, and the rest of the pixels shows a layout shortly after forming an insulating layer serving as a bank.

Figure 20:
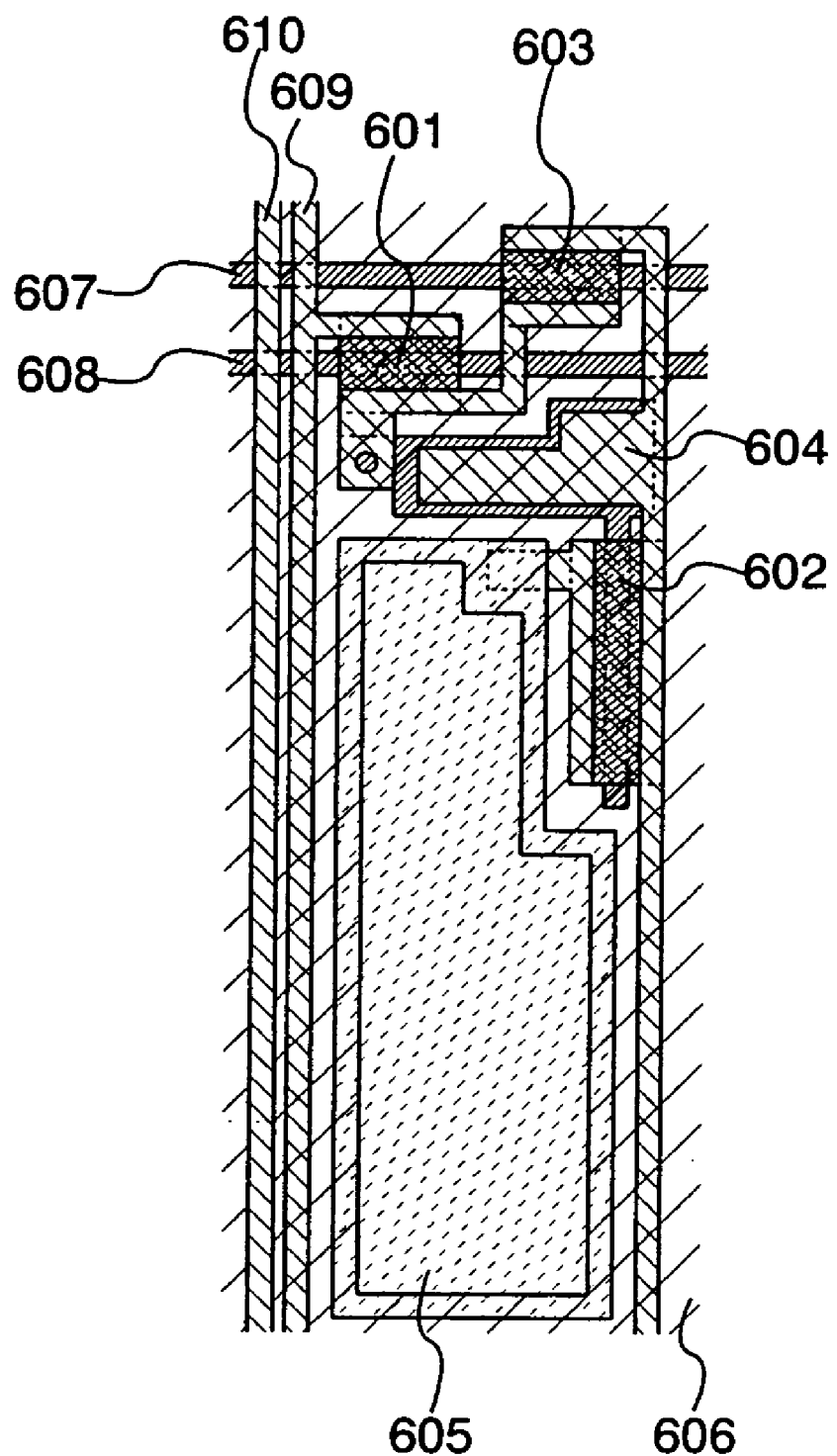
FIG. 20 is a layout diagram of a pixel circuit (3 TFT/Cell).
Figure 21:
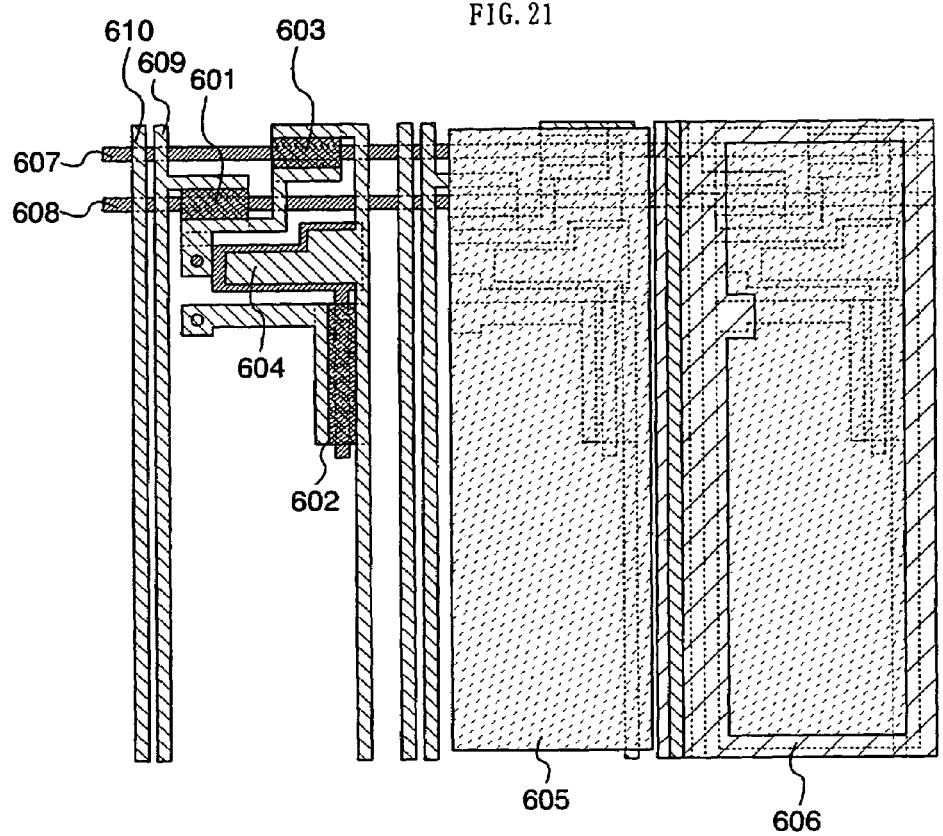
FIG. 21 is a layout diagram of a pixel circuit (3 TFT/Cell).

The first and second layout examples show a pixel having three transistors (3 TFT/Cell). The pixel comprises a switching transistor 601, a driving transistor 602, an erasing transistor 603, a capacitor 604, a signal line 609 and an auxiliary wiring 610 arranged in columns, and scan lines 607 and 608 arranged in rows (FIGS. 20 and 21). The pixel also comprises a pixel electrode 605 included in a light emitting element and an insulating layer 606. The insulating layer 606 is provided between the adjacent pixel electrodes 605, and has an opening portion so as to expose the auxiliary wiring 610 and the pixel electrode 605. The auxiliary wiring 610 is connected to a counter electrode via the opening portion provided in the insulating layer 606. An electro luminescent layer is provided so as to be in contact with the pixel electrode 605 via the opening portion in the insulating layer 606, and the counter electrode is provided so as to be in contact with the electro luminescent layer.

In the layout example shown in FIG. 20, either top emission, bottom emission, or dual emission may be adopted. On the other hand, in the layout example shown in FIG. 21, top emission is preferably adopted since the pixel electrode 605 is provided over the transistors 601 to 603. Dual emission may also be adopted in FIG. 21. In that case, the insulating layer 606 may be formed of a shielding material in order to shade the transistors 601 to 603.

Figure 22:
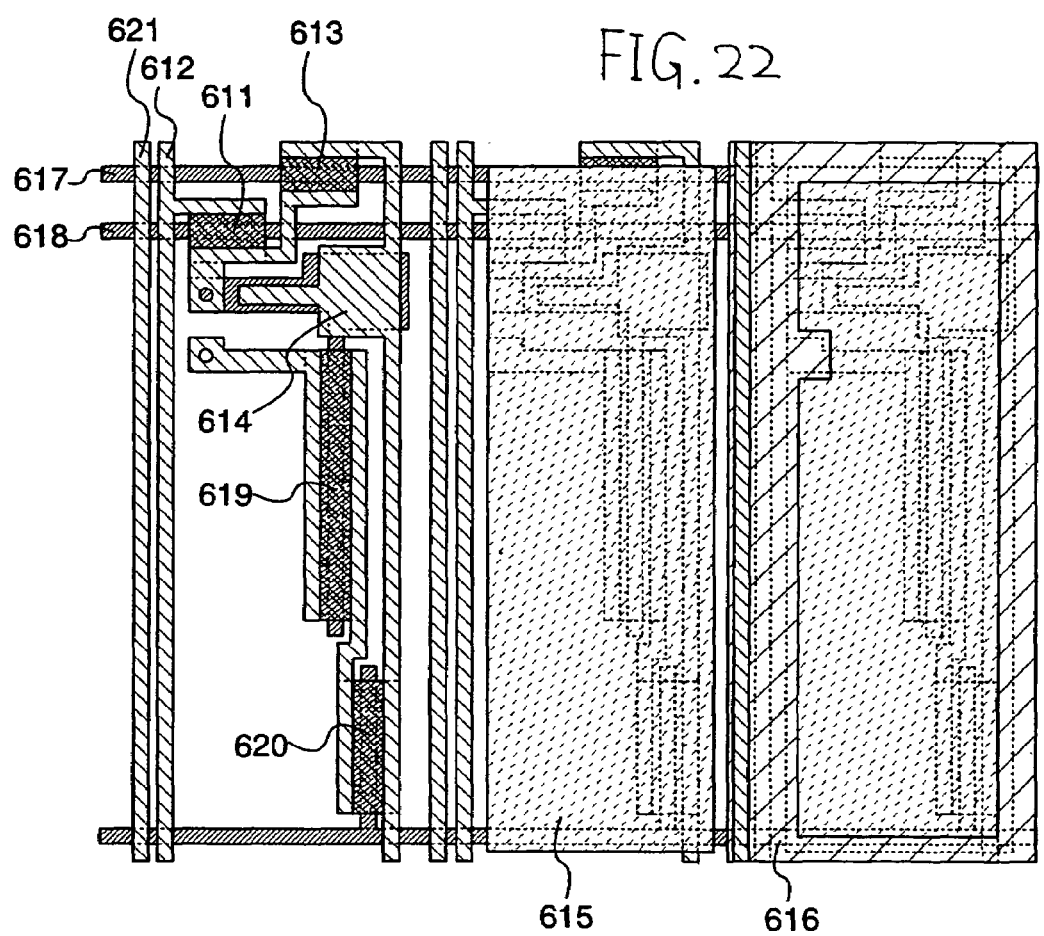
FIG. 22 is a layout diagram of a pixel circuit (4 TFT/Cell).
Figure 23:
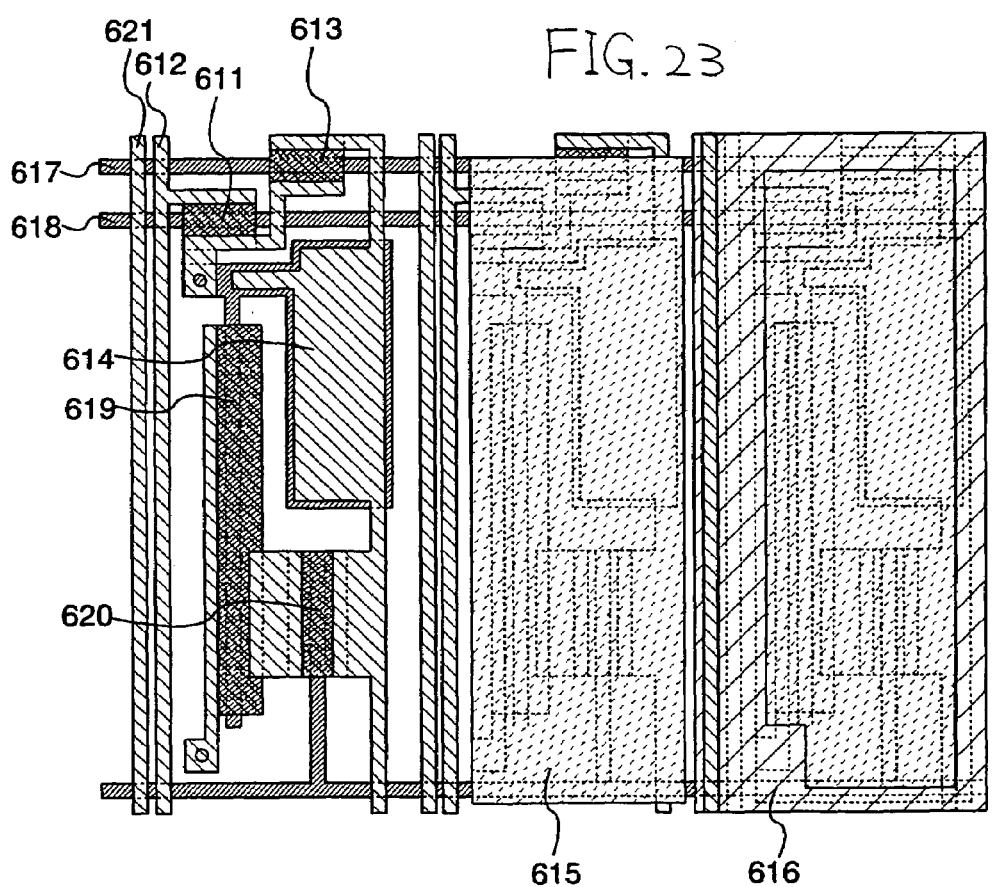
FIG. 23 is a layout diagram of a pixel circuit (4 TFT/Cell).

The third and fourth layout examples show a pixel having four transistors (4 TFT/Cell). The pixel comprises a transistor 611 for switching, a transistor 619 for driving, a transistor 620 for current controlling, a transistor 613 for erasing, a capacitor 614, a signal line 612 and an auxiliary wiring 621 arranged in columns, and scan lines 617 and 618 arranged in rows (FIGS. 22 and 23). The pixel also comprises a pixel electrode 615 included in a light emitting element and an insulating layer 616. The insulating layer 616 has an opening portion so as to expose the auxiliary wiring 621 and the pixel electrode 615. The auxiliary wiring 621 is connected to a counter electrode via the opening portion provided in the insulating layer 616. Further, an electro luminescent layer is provided so as to be in contact with the pixel electrode 615 via the opening portion in the insulating layer 616, and the counter electrode is provided so as to be in contact with the electro luminescent layer. According to such a structure, the pixel electrode 615 is provided over the transistors 611, 613, 619, and 620 leading to improved aperture ratio. Therefore, top emission is preferably adopted in this structure. It is to be noted that in the layout example shown in FIG. 22, dual emission may also be adopted. In that case, the insulating layer 616 may be formed of a shielding material so as to shade the transistors 611, 613, 619, and 620.

In the structures described above, the transistors 601 to 603, 611, 613, 619, and 620 include an amorphous semiconductor or an organic semiconductor for the channel portion. The auxiliary wiring 610 and 621 are formed either in the same layer as a gate electrode of the transistors 601 to 603, 611, 613, 619, and 620, in the same layer as a connecting wiring connected to either a source electrode or a drain electrode of the transistors 601 to 603, 611, 613, 619, and 620, or in the same layer as the pixel electrodes 605 and 615.

This application is based on Japanese Patent Application serial no. 2003-172009 filed in Japan Patent Office on 17, Jun., 2003, the contents of which are hereby incorporated by reference.

Although the present invention has been fully described by way of Embodiment Modes and Embodiments with reference to the accompanying drawings, it is to be understood that various changes and modifications will be apparent to those skilled in the art. Therefore, unless such changes and modifications depart from the scope of the present invention hereinafter defined, they should be constructed as being included therein.

What is claimed is:

1. A display device comprising:
    a transistor whose channel portion is formed of an amorphous semiconductor;
    a connecting wiring connected to a source electrode or a drain electrode of the transistor;
    a light emitting element having a laminated structure which includes a pixel electrode, an electro luminescent layer, and a counter electrode;
    an insulating layer surrounding an end portion of the pixel electrode; and
    an auxiliary wiring formed in the same layer as either a gate electrode of the transistor, the connecting wiring, or the pixel electrode,
    wherein the connecting wiring is connected to the pixel electrode;
    the auxiliary wiring is connected to the counter electrode via an opening portion provided in the insulating layer; and
    the opening portion is provided in a pixel portion comprising the light emitting element.

2. A device according to claim 1, further comprising a driver IC for controlling the transistor and the light emitting element,
    wherein the driver IC is attached over a substrate including the transistor and the light emitting element.

3. A device according to claim 1, further comprising a driver IC for controlling the transistor and the light emitting element,
    wherein the driver IC is connected to a connecting film which is attached over a substrate including the transistor and the light emitting element.

4. A device according to claim 1, wherein the transistor is a channel etched type transistor.

5. A device according to claim 1, wherein the transistor is a channel protected type transistor.

6. A device according to claim 1, wherein the transistor is a dual gate type transistor.

7. A device according to claim 1, wherein the light emitting element and the transistor are formed over a flexible substrate.

8. A device according to claim 1, further comprising a reverse bias voltage applying circuit for applying a reverse bias voltage to the light emitting element.

9. An electronic apparatus using the display device according to claim 1.

10. A device according to claim 1 wherein the display device is incorporated into one selected from the group consisting of a portable terminal, a portable game machine, a goggle type display, a monitor, a camera and a personal computer.

11. A display device comprising:
    a transistor whose channel portion is formed of an amorphous semiconductor;
    a connecting wiring connected to a source electrode or a drain electrode of the transistor;
    a light emitting element having a laminated structure which includes a pixel electrode, an electro luminescent layer, and a counter electrode;
    an insulating layer surrounding an end portion of the pixel electrode;
    an auxiliary wiring formed in the same layer as either a gate electrode of the transistor, the connecting wiring, or the pixel electrode; and
    a driver circuit controlling the transistor and the light emitting element,
    wherein the connecting wiring is connected to the pixel electrode;
    the auxiliary wiring is connected to the counter electrode via an opening portion provided in the insulating layer;
    the driver circuit comprises at least one of an N-type transistor whose channel portion is formed of an amorphous semiconductor and a P-type transistor whose channel portion is formed of an organic semiconductor; and
    the opening portion is provided in a pixel portion comprising the light emitting element.

12. A device according to claim 11, further comprising a driver IC for controlling the transistor and the light emitting element, wherein the driver IC is attached over a substrate including the transistor and the light emitting element.

13. A device according to claim 11, further comprising a driver IC for controlling the transistor and the light emitting element, wherein the driver IC is connected to a connecting film which is attached over a substrate including the transistor and the light emitting element.

14. A device according to claim 11, wherein the transistor is a channel etched type transistor.

15. A device according to claim 11, wherein the transistor is a channel protected type transistor.

16. A device according to claim 11, wherein the transistor is a dual gate type transistor.

17. A device according to claim 11, wherein the light emitting element and the transistor are formed over a flexible substrate.

18. A device according to claim 11, further comprising a reverse bias voltage applying circuit for applying a reverse bias voltage to the light emitting element.

19. An electronic apparatus using the display device according to claim 11.

20. A device according to claim 11 wherein the display device is incorporated into one selected from the group consisting of a portable terminal, a portable game machine, a goggle type display, a monitor, a camera and a personal computer.

21. A display device comprising:
    a transistor whose channel portion is formed of an organic semiconductor;
    a connecting wiring connected to a source electrode or a drain electrode of the transistor;
    a light emitting element having a laminated structure which includes a pixel electrode, an electro luminescent layer, and a counter electrode;
    an insulating layer surrounding an end portion of the pixel electrode; and
    an auxiliary wiring formed in the same layer as either a gate electrode of the transistor, the connecting wiring, or the pixel electrode,
    wherein the connecting wiring is connected to the pixel electrode;
    the auxiliary wiring is connected to the counter electrode via an opening portion provided in the insulating layer; and
    the opening portion is provided in a pixel portion comprising the light emitting element.

22. A device according to claim 21, further comprising a driver IC for controlling the transistor and the light emitting element,
    wherein the driver IC is attached over a substrate including the transistor and the light emitting element.

23. A device according to claim 21, further comprising a driver IC for controlling the transistor and the light emitting element, wherein the driver IC is connected to a connecting film which is attached over a substrate including the transistor and the light emitting element.

24. A device according to claim 21, wherein the transistor is a channel etched type transistor.

25. A device according to claim 21, wherein the transistor is a channel protected type transistor.

26. A device according to claim 21, wherein the transistor is a dual gate type transistor.

27. A device according to claim 21, wherein the light emitting element and the transistor are formed over a flexible substrate.

28. A device according to claim 21, further comprising a reverse bias voltage applying circuit for applying a reverse bias voltage to the light emitting element.

29. An electronic apparatus using the display device according to claim 21.

30. A device according to claim 21 wherein the display device is incorporated into one selected from the group consisting of a portable terminal, a portable game machine, a goggle type display, a monitor, a camera and a personal computer.

31. A display device comprising:
- a transistor whose channel portion is formed of an organic semiconductor;
- a connecting wiring connected to a source electrode or a drain electrode of the transistor;
- a light emitting element having a laminated structure which includes a pixel electrode, an electro luminescent layer, and a counter electrode;
- an insulating layer surrounding an end portion of the pixel electrode;
- an auxiliary wiring formed in the same layer as either a gate electrode of the transistor, the connecting wiring, or the pixel electrode; and
- a driver circuit controlling the transistor and the light emitting element,
- wherein the connecting wiring is connected to the pixel electrode;
- the auxiliary wiring is connected to the counter electrode via an opening portion provided in the insulating layer;
- the driver circuit comprises at least one of an N-type transistor whose channel portion is formed of an amorphous semiconductor and a P-type transistor whose channel portion is formed of an organic semiconductor; and
- the opening portion is provided in a pixel portion comprising the light emitting element.

32. A device according to claim 31, further comprising a driver IC for controlling the transistor and the light emitting element,
wherein the driver IC is attached over a substrate including the transistor and the light emitting element.

33. A device according to claim 31, further comprising a driver IC for controlling the transistor and the light emitting element,
wherein the driver IC is connected to a connecting film which is attached over a substrate including the transistor and the light emitting element.

34. A device according to claim 31, wherein the transistor is a channel etched type transistor.

35. A device according to claim 31, wherein the transistor is a channel protected type transistor.

36. A device according to claim 31, wherein the transistor is a dual gate type transistor.

37. A device according to claim 31, wherein the light emitting element and the transistor are formed over a flexible substrate.

38. A device according to claim 31, further comprising a reverse bias voltage applying circuit for applying a reverse bias voltage to the light emitting element.

39. An electronic apparatus using the display device according to claim 31.

40. A device according to claim 31 wherein the display device is incorporated into one selected from the group consisting of a portable terminal, a portable game machine, a goggle type display, a monitor, a camera and a personal computer.

* * * * *